(12) United States Patent
Aritome

(10) Patent No.: US 8,687,429 B2
(45) Date of Patent: Apr. 1, 2014

(54) SEMICONDUCTOR DEVICE AND METHODS OF OPERATING THE SAME

(75) Inventor: Seiichi Aritome, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 10 days.

(21) Appl. No.: 13/542,372

(22) Filed: Jul. 5, 2012

(65) Prior Publication Data

US 2013/0010547 A1     Jan. 10, 2013

(30) Foreign Application Priority Data

Jul. 6, 2011    (KR) .................. 10-2011-0066807
Jun. 26, 2012    (KR) .................. 10-2012-0068531

(51) Int. Cl.
*G11C 16/06* (2006.01)

(52) U.S. Cl.
USPC ............. 365/185.21; 365/185.22; 365/185.18

(58) Field of Classification Search
USPC ............. 365/185.21, 185.22, 185.18, 189.07, 365/189.09
See application file for complete search history.

(56) References Cited

U.S. PATENT DOCUMENTS

| | | | |
|---|---|---|---|
| 7,388,788 B2 * | 6/2008 | Honda | ................. 365/185.21 |
| 7,471,565 B2 | 12/2008 | Aritome | |
| 7,561,469 B2 | 7/2009 | Aritome | |

* cited by examiner

*Primary Examiner* — David Lam
(74) *Attorney, Agent, or Firm* — William Park & Associates Patent Ltd.

(57) ABSTRACT

A method of operating a semiconductor device includes programming selected memory cells by supplying a selected word line with a program voltage which increases and supplying the remaining unselected word lines with a first pass voltage which is substantially constant; and programming the selected memory cells while supplying first unselected word lines adjacent to the selected word line with a second pass voltage increasing in proportion to the program voltage, when a difference between the program voltage and the first pass voltage reaches a critical voltage difference.

18 Claims, 7 Drawing Sheets

SEMICONDUCTOR DEVICE AND METHODS OF OPERATING THE SAME

CROSS-REFERENCE TO RELATED APPLICATION

The present application claims priority to Korean patent application numbers 10-2011-0066807 filed on Jul. 6, 2011, and 10-2012-0068531 filed on Jun. 26, 2012, the entire disclosure of which is incorporated by reference hereinin its entirety.

BACKGROUND

1. Technical Field

Embodiments of this disclosure relate generally to a semiconductor device and methods of operating the same and, more particularly, to a program method.

2. Related Art

A semiconductor device includes a memory cell array in which data is stored. The memory cell array includes a plurality of cell blocks. Each of the cell blocks includes a plurality of cell strings. The cell strings have the same structure, and thus, only one of the cell strings is described below in detail.

FIG. 1 is a circuit diagram illustrating a cell string.

Referring to FIG. 1, the cell string includes a drain select transistor, a plurality of memory cells, and a source select transistor which are coupled in series. The gate of the drain select transistor is coupled to a drain select line DSL, the gates of the memory cells are coupled to respective word lines WLn−k to WLn+k (i.e., WLn−k, WLn−2 WLn−1, WLn, WLn+1, WLn+2, . . . , WLn+k), and the gate of the source select transistor is coupled to a source select line SSL. The drain select line DSL is coupled in common to the drain select transistors included in different cell strings. The word lines WLn−k to WLn+k are coupled in common to the memory cells included in different cell strings. The source select line SSL is coupled in common to the source select transistors included in different cell strings.

A method of programming a memory cell selected from among the memory cells included in the cell string is described below.

A program voltage Vpgm is supplied to a selected word line WLn coupled to a selected memory cell 11. A pass voltage Vpass is supplied to unselected word lines WLn−1 to WLn−k and WLn+1 to WLn+k coupled to unselected memory cells. The selected memory cell 11 may be programmed by supplying the program voltage Vpgm to the selected word line WLn only once. In order to narrow the width of a distribution of the threshold voltages of memory cells, however, the program operation is recently performed in accordance with an Incremental Step Pulse Program (hereinafter referred to as an 'ISPP') method of gradually raising the program voltage Vpgm. The program operation using an ISPP method is described below.

FIG. 2 is a graph illustrating a known program method.

Referring to FIGS. 1 and 2, a program operation using an ISPP method is performed by supplying the program voltage Vpgm to the selected word line WLn and supplying a constant pass voltage Vpass(1) or an increasing pass voltage Vpass(2) to the remaining unselected word lines WLn−1 to WLn−k and WLn+1 to WLn+k. The increasing pass voltage Vpass(2) increases as a step-up level lower than that of the program voltage Vpgm. In general, the constant pass voltage Vpass(1) or the increasing pass voltage Vpass(2) has a level lower than the program voltage Vpgm. More particularly, the program voltage Vpgm having a low level is supplied at the early stage of program, and the program voltage Vpgm having a gradually higher level is supplied according to an increase in the number of program voltages Vpgm. After the program voltage Vpgm and the constant pass voltage Vpass(1) or the increasing pass voltage Vpass(2) are supplied, a verify operation for determining whether the threshold voltage of the selected memory cell has reached a target voltage is performed. If, as a result of the verify operation, the threshold voltage of the selected memory cell is determined not to have reached the target voltage, the program operation and the verify operation are repeated by supplying the program voltage Vpgm and the constant pass voltage Vpass(1) or the increasing pass voltage Vpass(2) while gradually raising the program voltage Vpgm by a step level until the threshold voltage of the selected memory cell reaches the target voltage. If, as a result of the verify operation, the threshold voltage of the selected memory cell is determined to have reached the target voltage, the program operation is terminated.

While the program operation is performed, the program voltage Vpgm is gradually raised, whereas the constant pass voltage Vpass(1) or the increasing pass voltage Vpass(2) is supplied to the unselected word lines WLn−1 to WLn−k and WLn+1 to WLn+k. Accordingly, a difference in the level between the program voltage Vpgm and the constant pass voltage Vpass(1) or the increasing pass voltage Vpass(2) is gradually increased.

Particularly, in case of an unselected memory cells 12 adjacent to the selected memory cell 11, if the level of the program voltage Vpgm supplied to the selected word line WLn is higher than a specific level, the threshold voltages of the unselected memory cells 12 may be decreased under the influence of the raised program voltage Vpgm. That is, if the program voltage Vpgm gradually rises and becomes higher than a Critical voltage Difference (hereinafter referred to as a 'CD') between the program voltage Vpgm and the pass voltage Vpass, a breakdown between the unselsected memory cells 12 and the selected memory cells 11 may be occurred. Furthermore, electrons which are stored in a floating gate of the unselected memory cells 12 adjacent to the selected memory cell 11 may eject to a control gate of the selected memory cell 11, and so the threshold voltages of the unselected memory cells 12 may decrease. In particular, if the threshold voltage of a memory cell on which program has been completed, from among the unselected memory cells 12 adjacent to the selected memory cell 11, is changed, different data may be read from the memory cell on which a program has been completed in a read operation. Consequently, the reliability of the semiconductor device may deteriorate.

BRIEF SUMMARY

In accordance with an embodiment of this disclosure, unselected memory cells adjacent to a selected memory cell are prevented from being erased by preventing a difference between a program voltage and a pass voltage from rising higher than a critical value in a program operation.

A method of operating a semiconductor device according to an aspect of the present disclosure includes programming selected memory cells by supplying a selected word line with a program voltage which increases and supplying the remaining unselected word lines with a first pass voltage which is substantially constant; and programming the selected memory cells while supplying first unselected word lines adjacent to the selected word line with a second pass voltage increasing in proportion to the program voltage, when a difference between the program voltage and the first pass voltage reaches a critical voltage difference.

A method of operating a semiconductor device according to another aspect of this disclosure includes programming selected memory cells coupled to a selected word line by supplying the selected word line with a program voltage which increases and supplying remaining unselected word lines with a ninth pass voltage which increases and has a voltage level lower than the program voltage; and programming the selected memory cells by supplying first unselected word lines adjacent to the selected word line with a second pass voltage increasing in proportion to the program voltage, when a difference between the program voltage and the ninth pass voltage reaches a critical voltage difference while programming the selected memory cells.

A semiconductor device according to yet another aspect of this disclosure includes a memory cell array, a voltage generator for generating a program voltage, a pass voltage, a read voltage, and an erase voltage, a row decoder for transferring the voltages of the voltage generator to word lines of the memory cell array, a comparator for comparing the program voltage and the pass voltage of the voltage generator and generating a critical signal when a difference between the program voltage and the pass voltage reaches a critical voltage difference as a result of the comparison, and a controller for increasing or decreasing the pass voltage of the voltage generator in response to the critical signal.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
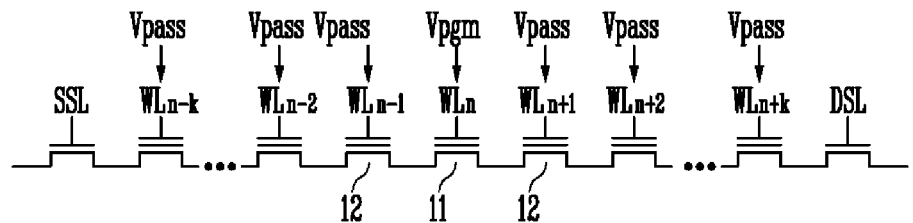
FIG. 1 is a circuit diagram illustrating a cell string.
Figure 2:
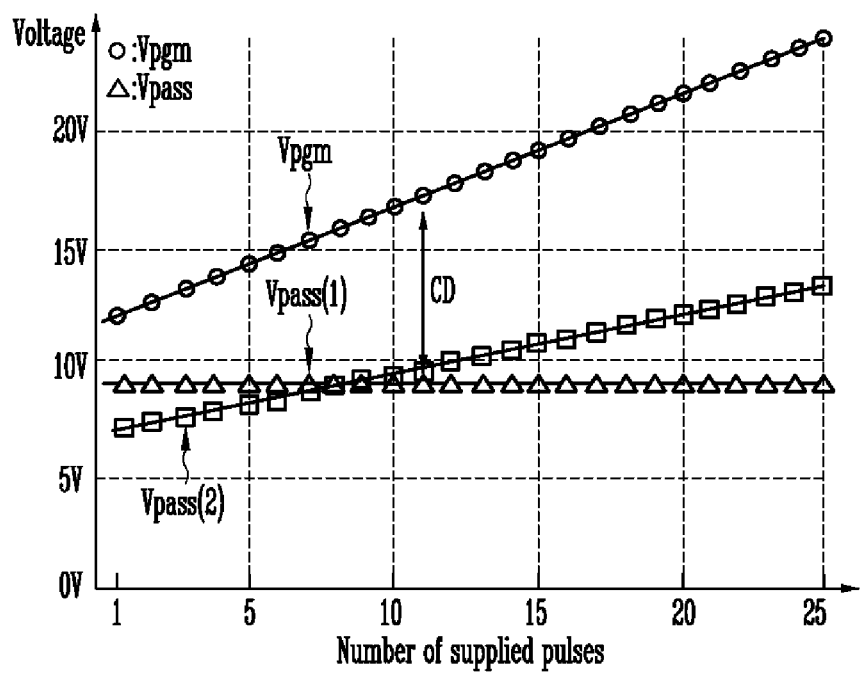
FIG. 2 is a graph illustrating a known program method.
Figure 3:
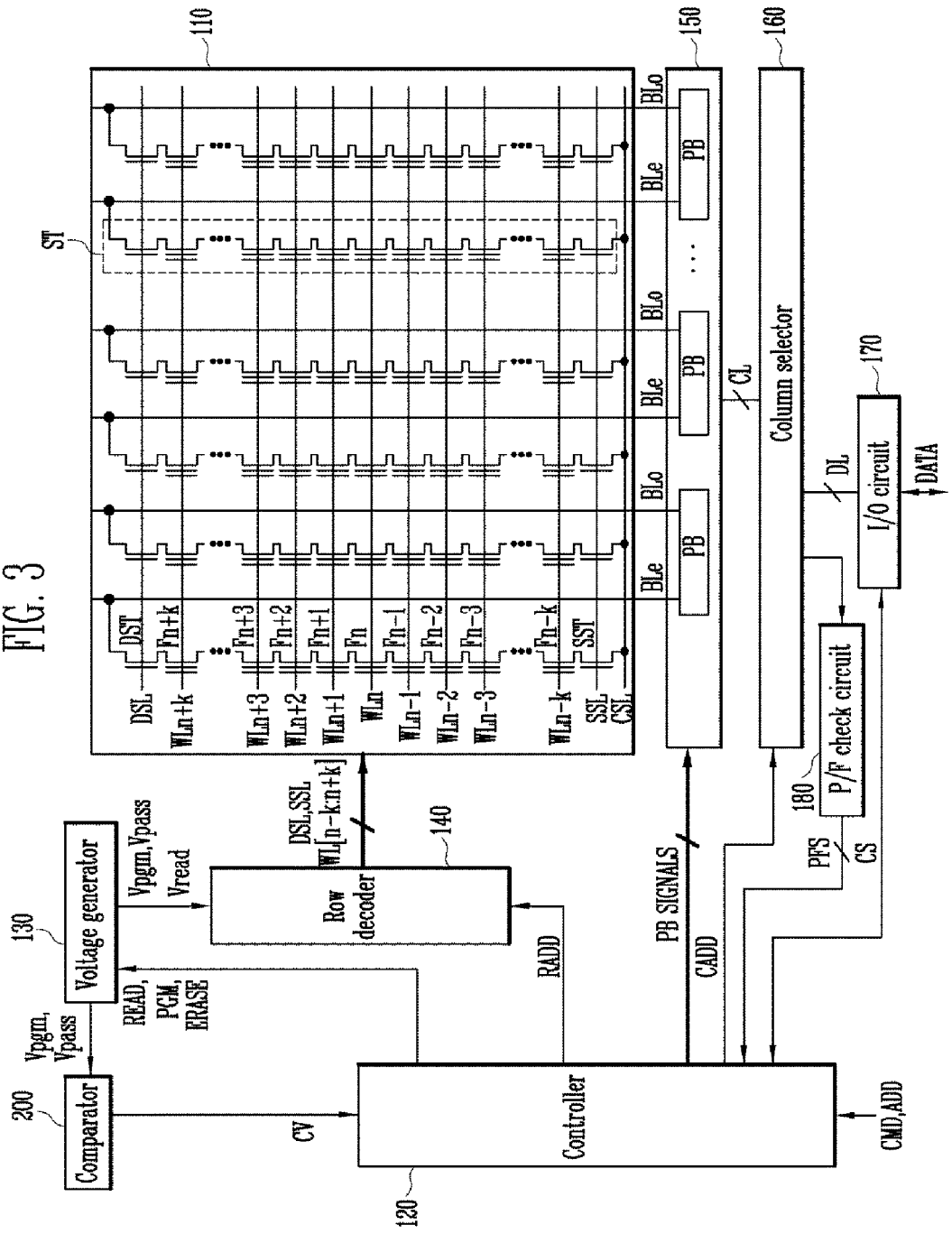
FIG. 3 is a block diagram illustrating a semiconductor device.

FIG. 3 is a block diagram illustrating a semiconductor device.

Referring to FIG. 3, the semiconductor device may include a memory cell array 110, a circuit group (130, 140, 150, 160, 170, 180, and 200) configured to perform a program operation, a read operation, or an erase operation on memory cells included in the memory cell array 110, and a controller 120 configured to control the circuit group (130, 140, 150, 160, 170, 180, and 200) in order to set the threshold voltage levels of selected memory cells based on input data.

In the case of a NAND flash memory device, the circuit group may include a voltage generator 130, a row decoder 140, a page buffer group 150, a column selector 160, an I/O circuit 170, a Pass/Fail (P/F) check circuit 180, and a comparator 200.

The memory cell array 110 may include a plurality of memory cells coupled to word lines and bit lines. The memory cell array 110 may include a plurality of cell blocks. Only one of the cell blocks is illustrated in FIG. 3, for example. The cell block may include a plurality of cell strings ST. Some of the cell strings ST may be designated as normal strings, and some of the cell strings ST may be designated as flag strings. The cell strings ST may have the same construction. Each of the cell strings ST may include a source select transistor SST coupled to a common source line CSL, a plurality of memory cells Fn−k to Fn+k (i.e., Fn−k, . . . , Fn−3, Fn−2, Fn−1, Fn, Fn+1, Fn+2, Fn+3, . . . , Fn+k), and a drain select transistor DST coupled to each bit line BLe or BLo. Memory cells included in the flag string may be called flag cells, and they may have the same construction as normal memory cells included in the normal strings. The gate of the source select transistor SST may be coupled to a source select line SSL, the gates of the memory cells Fn−k to Fn+k may be coupled to respective word lines WLn−k to WLn+k (i.e., WLn−k, . . . , WLn−3, WLn−2 WLn−1, WLn, WLn+1, WLn+2, WLn+3, . . . , WLn+k), and the gate of the drain select transistor DST may be coupled to a drain select line DSL. The cell strings ST may be coupled to respective bit lines BLe and BLo and may be coupled to the common source lines CSL that are in common with one another.

The voltage supply circuit (130 and 140) may supply voltages necessary for a program operation, a read operation, or an erase operation on the memory cells to the drain select line DSL, the word lines WLn−k to WLn+k, the source select line SSL, and the well of a selected cell block in response to signals PGM, ERASE, READ, and RADD generated from the controller 120. The voltage supply circuit may include the voltage generator 130 and the row decoder 140.

The voltage generator 130 may output operating pulses for programming, reading, or erasing memory cells to global lines in response to the operating signals PGM, READ, and ERASE, that is, the internal command signals of the controller 120 and also outputs operating pulses (for example, Vpgm, Vpass, and Vread) for programming to the global lines when memory cells are programmed. Here, for example, Vpgm denotes a program voltage, Vpass denotes a pass voltage, and Vread denotes a read pulse.

The row decoder 140 may transfer the operating pulses of the voltage generator 130 to the local lines DSL, SSL, and WL[n−k:n+k] of a selected cell block in response to row address signals RADD generated from the controller 120.

The comparator 200 may compare the program voltage Vpgm and the pass voltage Vpass generated from the voltage generator 130 in a program operation and may generate a critical signal CV if, as a result of the comparison, a difference between the program voltage Vpgm and the pass voltage Vpass may be a critical value or higher.

The page buffer group 150 may detect the program state or the erase state of the memory cells. The page buffer group 150 may include page buffers PB each coupled to the bit lines BLe and BLo and may supply the voltages necessary to store data in the memory cells Fn−k to Fn+k through the respective bit lines BLe and BLo in response to page buffer signals PB SIGNALS generated from the controller 120. The page buffer group 150 may precharge the bit lines BLe and BLo or latches data, corresponding to the threshold voltage levels of the memory cells Fn−k to Fn+k which may be detected based on shifts in the voltages of the bit lines BLe and BLo, in a program operation, an erase operation, or a read operation on the memory cells Fn−k to Fn+k. That is, the page buffer group 150 may supply a program permission voltage (for example, a ground voltage) or a program inhibition voltage (for example, a power source voltage) to the bit lines BLe or BLo based on data inputted to the latches in the program operation and detect data stored in the memory cells Fn−k to Fn+k by controlling the voltages of the bit lines BLe to BLo based on data stored in the memory cells Fn−k to Fn+k in the read operation. Furthermore, the page buffer group 150 may supply an erase permission voltage (for example, a power source voltage) to the bit lines BLe and BLo at the early stage of the erase operation and supply a program permission voltage (for example, a ground voltage) to bit lines coupled to erased strings ST in a program operation performed according to a result of an erase verify operation during an erase operation.

The column selector 160 may select the page buffers PB of the page buffer group 150 in response to a column address signal CADD generated from the controller 120. Data latched in a page buffer selected by the column selector 160 may be outputted. Furthermore, the column selector 160 may receive data from the page buffer group 150 through a column line CL and transfer the data to the P/F check circuit 180.

The I/O circuit 170 may transfer external input data DATA to the column selector 160, through for example a data line DL, under the control of the controller 120 in a program operation so that the input data DATA may be inputted to the page buffers PB of the page buffer group 150. When the column selector 160 sequentially transfers the input data DATA to the page buffers PB of the page buffer group 150, the page buffers PB may store the input data DATA in their internal latches. Furthermore, in a read operation, the I/O circuit 170 may externally output data DATA received from the page buffers PB of the page buffer group 150 via the column selector 160.

The P/F check circuit 180 may check whether an error cell has occurred or not in a verify operation subsequent to a program or erase operation and may generate a result of the check in the form of a check signal PFC. Furthermore, the P/F check circuit 180 may count the number of error cells and generate a result of the count in the form of a count signal CS. The controller 120 may control the level of the program voltage Vpgm supplied to a selected word line in the program operation of memory cells and may also control the voltage generator 130 so that verify voltages are selectively supplied to a selected word line in a program verify operation. In this case, the controller 120 may control the voltage generator 130 in response to the count signal CS of the P/F check circuit 180.

The controller 120 may internally generate the program operation signal PGM, the read operation signal READ, or the erase operation signal ERASE in response to the command signal CMD and an address signal ADD (and/or, for example, an address signal ADD) and generate the page buffer signals PB SIGNALS for controlling the page buffers PB of the page buffer group 150 according to the type of an operation. Furthermore, the controller 120 may check whether the threshold voltages of selected memory cells have risen to a target level or not in response to the count signal CS of the P/F check circuit 180 in a program or erase verify operation and determine whether to perform a program or erase operation again or whether a result of the program or erase operation is a pass or fail according to a result of the check.

The controller 120 may control the rise or fall level of the pass voltage Vpass, generated from the voltage generator 130, in response to the critical signal CV in a program operation. That is, in the program operation, when a difference between the program voltage Vpgm and the pass voltage Vpass reaches a critical value, the comparator 200 may generate the critical signal CV, and the controller 120 may control the voltage generator 130 so that the voltage generator 130 generates a varied pass voltage Vpass in response to the critical signal CV.

Some exemplary program methods using the above-described semiconductor device are described below.

Figure 4:
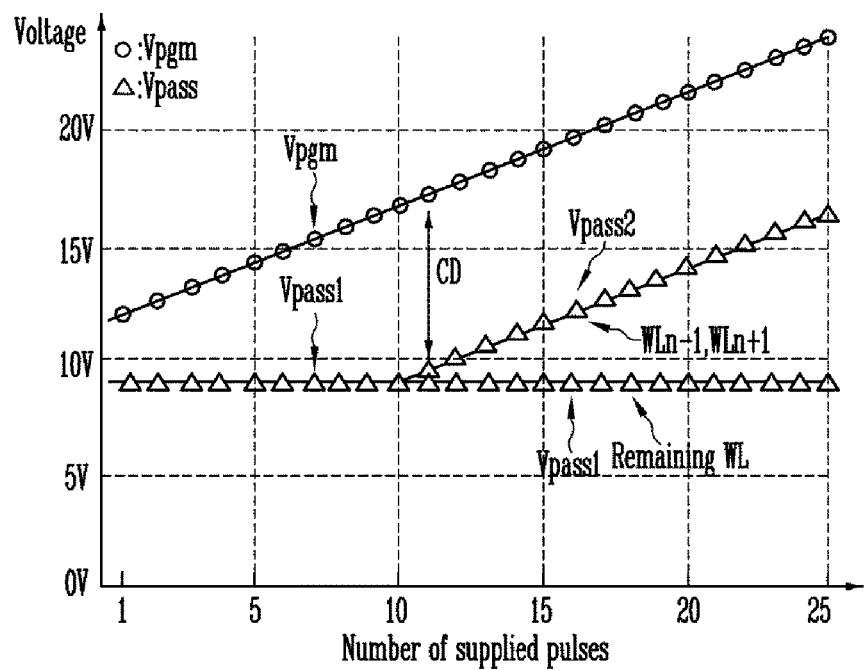
FIG. 4 is a graph illustrating a program method according to a first embodiment of this disclosure.

FIG. 4 is a graph illustrating a program method according to a first embodiment of this disclosure.

Referring to FIGS. 4 and 3, a program operation may be performed according to an ISPP method of gradually raising the program voltage Vpgm. In the program operation, a program permission voltage (for example, a ground voltage) may be supplied to selected bit lines coupled to selected cell strings, a program inhibition voltage (for example, a power source voltage) may be supplied to unselected bit lines coupled to unselected cell strings. In the state in which the program permission voltage or the program inhibition voltage has been supplied to the bit lines, the program voltage Vpgm which gradually rises may be supplied to a selected word line WLn, and the pass voltage Vpass may be supplied to the remaining unselected word lines WLn−1 to WLn−k and WLn+1 to WLn+k. In the program operation using an ISPP method, the program voltage Vpgm may be raised by step level. At the early stage of the program operation, a difference between the program voltage Vpgm and a first pass voltage Vpass1 may be smaller than a CD. Accordingly, the program voltage Vpgm which gradually rises may be supplied to the selected word line WLn coupled to selected memory cells Fn, the first pass voltage Vpass having a constant level may be supplied to the remaining unselected word lines WLn−1 to WLn−k and WLn+1 to WLn+k. The CD may refer to a maximum voltage difference for preventing the first unselected memory cells Fn−1 and Fn+1 adjacent to the selected memory cells Fn from being erased under the influence of the program voltage Vpgm when the selected memory cells Fn are programmed. The CD may be different according to a semiconductor device and may be calculated by testing the semiconductor device. In the present embodiment, and for example purposes only, it is assumed that the CD is 7.5 V.

If the first program voltage Vpgm supplied to the selected word line WLn is, for example, 12 V and the first pass voltage Vpass1 is, for example, 9 V, a difference between the first program voltage Vpgm and the first pass voltage Vpass1 is 3 V and is, thus, lower than the CD. In this case, the first unselected memory cells Fn−1 and Fn+1 adjacent to the selected memory cells Fn are not influenced by the first program voltage Vpgm, and the first pass voltage Vpass1 is supplied to all the unselected word lines WLn−1 to WLn−k and WLn+1 to WLn+k. That is, when the threshold voltages of the selected memory cells Fn do not reach a target voltage and until a difference between the program voltage Vpgm and the first pass voltage Vpass1 reaches the CD, the program voltage Vpgm may be gradually raised by the step level in proportion to the number of program voltages Vpgm, and the first pass voltage Vpass1 may maintain a constant level.

If the program operation is performed while gradually raising the program voltage Vpgm and a difference between the program voltage Vpgm and the first pass voltage Vpass1 reaches the CD, a second pass voltage Vpass2 which gradually rises may also be supplied to the first unselected word lines WLn−1 and WLn+1 adjacent to both ends of the selected word line WLn. At this time, the first pass voltage Vpass1 having a constant level may continue to be supplied to the remaining unselected word lines WLn−2 to WLn−k and WLn+2 to WLn+k other than the first unselected word lines WLn−1 and WLn+1. The second pass voltage Vpass2 may be gradually raised so that a difference between the second pass voltage Vpass2 and the program voltage Vpgm is not higher than the CD. Preferably, the second pass voltage Vpass2 is gradually raised by taking the efficiency of the program operation into consideration so that a difference between the second pass voltage Vpass2 and the program voltage Vpgm is not higher than the CD. That is, the step-up level of the second pass voltage Vpass2 may be set identically or substantially the same with the step level of the program voltage Vpgm. For example, if the step level of the program voltage Vpgm is 0.5 V, the second pass voltage Vpass2 may also be gradually raised by 0.5 V.

As described above, after a difference between the program voltage and the pass voltage reaches the CD, the pass voltage supplied to the first unselected word lines WLn−1 and WLn+1 adjacent to the selected word line WLn may be gradually raised so that a difference between the program voltage and the pass voltage does not exceed the CD. Accordingly, a decrease of the threshold voltages of the first unselected memory cells Fn−1 and Fn+1 adjacent to the selected memory cell Fn can be prevented.

Figure 5:
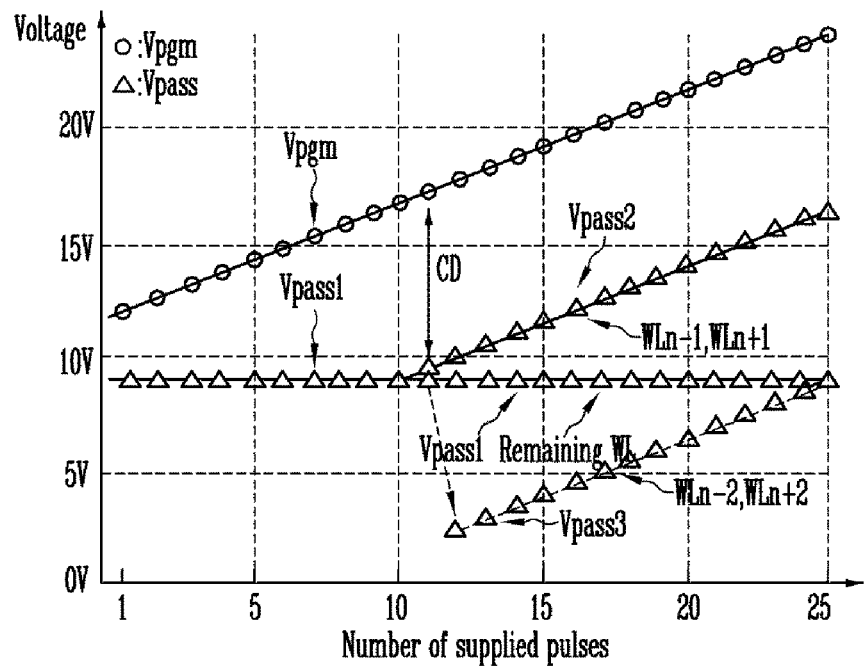
FIG. 5 is a graph illustrating a program method according to a second embodiment of this disclosure.

FIG. 5 is a graph illustrating a program method according to a second embodiment of this disclosure.

Referring to FIGS. 5 and 3, a program operation may be performed according to an ISPP method of gradually raising the program voltage Vpgm. In the program operation, a program permission voltage (for example, a ground voltage) may be supplied to selected bit lines coupled to selected cell strings, a program inhibition voltage (for example, a power source voltage) may be supplied to unselected bit lines coupled to unselected cell strings. In the state in which the program permission voltage or the program inhibition voltage has been supplied to the bit lines, the program voltage Vpgm which gradually rises may be supplied to a selected word line WLn, and the pass voltage Vpass may be supplied to the remaining unselected word lines WLn−1 to WLn−k and WLn+1 to WLn+k. In the program operation using an ISPP method, the program voltage Vpgm may be raised by a step level. At the early stage of the program operation, a difference between the program voltage Vpgm and a first pass voltage Vpass1 may be smaller than a CD. Accordingly, the program voltage Vpgm which gradually rises may be supplied to the selected word line WLn coupled to selected memory cells Fn, the first pass voltage Vpass having a constant level may be supplied to the remaining unselected word lines WLn−1 to WLn−k and WLn+1 to WLn+k. The CD refers to a maximum voltage difference for preventing the first unselected memory cells Fn−1 and Fn+1 adjacent to the selected memory cells Fn from being erased under the influence of the program voltage Vpgm when the selected memory cells Fn are programmed. The CD may be different according to a semiconductor device and may be calculated by testing the semiconductor device. In the present embodiment, it may be assumed, for example, that the CD is 7.5 V.

If the first program voltage Vpgm supplied to the selected word line WLn is, for example, 12 V and the first pass voltage Vpass1 is, for example, 9 V, a difference between the first program voltage Vpgm and the first pass voltage Vpass1 is 3 V and is lower than the CD. In this case, the first unselected memory cells Fn−1 and Fn+1 adjacent to the selected memory cell Fn are rarely influenced by the first program voltage Vpgm, and the first pass voltage Vpass1 may be supplied to all the unselected word lines WLn−1 to WLn−k and WLn+1 to WLn+k. That is, when the threshold voltages of the selected memory cells Fn do not reach a target voltage and until a difference between the program voltage Vpgm and the first pass voltage Vpass1 reaches the CD, the program voltage Vpgm may be gradually raised by the step level in proportion to the number of program voltages Vpgm, and the first pass voltage Vpass1 may maintain a constant level.

If the program operation is performed while gradually raising the program voltage Vpgm and a difference between the program voltage Vpgm and the first pass voltage Vpass1 reaches the CD, a second pass voltage Vpass2 which gradually rises may be supplied to the first unselected word lines WLn−1 and WLn+1 adjacent to both ends of the selected word line WLn, and a third pass voltage Vpass3 lower than the first pass voltage Vpass1 by the CD may be supplied to the second unselected word lines WLn−2 and WLn+2 adjacent to the first unselected word lines WLn−1 and WLn+1. At this time, the first pass voltage Vpass1 continues to be supplied to the remaining unselected word lines WLn−3 to WLn−k and WLn+3 to WLn+k other than the first unselected word lines WLn−1 and WLn+1 and the second unselected word lines WLn−2 and WLn+2. The second pass voltage Vpass2 is gradually raised so that a difference between the second pass voltage Vpass2 and the program voltage Vpgm is not higher than the CD. Preferably, the second pass voltage Vpass2 may be gradually raised by taking the efficiency of the program operation into consideration so that a difference between the second pass voltage Vpass2 and the program voltage Vpgm is substantially equal to the CD. That is, the step-up level of the second pass voltage Vpass2 may be set identically or substantially the same with the step level of the program voltage Vpgm. The third pass voltage Vpass3 may be a pulse supplied to the second unselected memory cells Fn−2 and Fn+2 adjacent to the first unselected memory cells Fn−1 and Fn+1 to which the second pass voltage Vapss2 may be supplied. That is, in order to prevent the threshold voltages of the second unselected memory cells Fn−2 and Fn+2 from decreasing owing to the influence of the second pass voltage Vpass2 which gradually rises (for example, coupling), after the level of the first pass voltage Vpass1 supplied to the second unselected word lines WLn−2 and WLn+2 coupled to the second unselected memory cells Fn−2 and Fn+2, respectively, may be lowered by the CD, the third pass voltage Vpass3 which gradually rises may be supplied. For example, when the step level of the program voltage Vpgm is 0.5 V, the second pass voltage Vpass2 and the third pass voltage Vpass3 may also be gradually raised by 0.5 V.

As described above, since the pass voltage supplied to the first unselected word lines WLn−1 and WLn+1 adjacent to the selected word line WLn is made lower than the CD, the first unselected memory cells Fn−1 and Fn+1 adjacent to the selected memory cells Fn can be prevented from being erased in the program operation of the selected memory cells Fn. Furthermore, after the second pass voltage Vpass2 is supplied, the third pass voltage Vpass3 lower than the second pass voltage Vapss2 by the CD may be supplied to the second unselected word lines WLn−2 and WLn+2. Accordingly, the threshold voltages of the second unselected memory cells Fn−2 and Fn+2 adjacent to the first unselected memory cells Fn−1 and Fn+1 can be prevented from decreasing.

Figure 6:
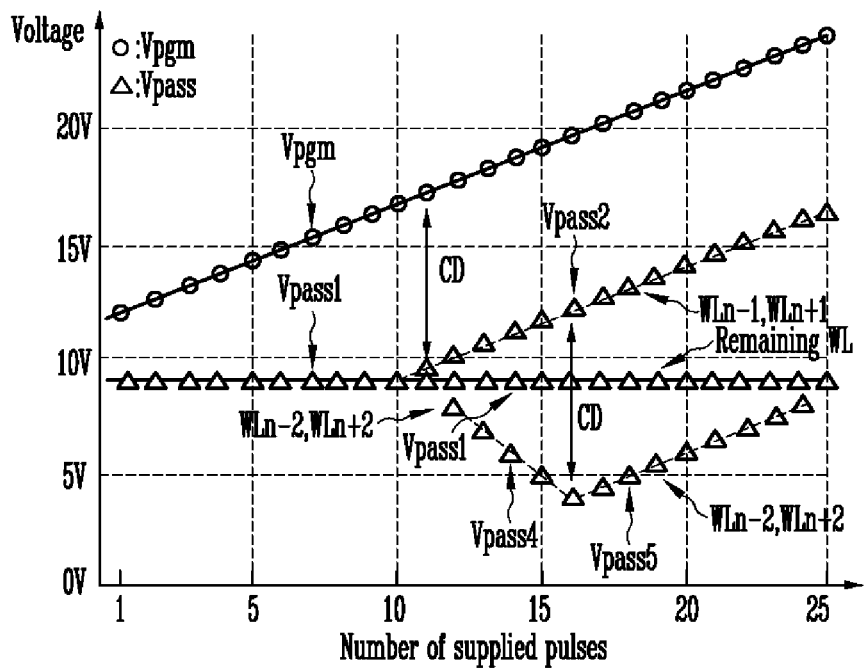
FIG. 6 is a graph illustrating a program method according to a third embodiment of this disclosure.

FIG. 6 is a graph illustrating a program method according to a third embodiment of this disclosure.

Referring to FIGS. 6 and 3, a program operation is performed according to an ISPP method of gradually raising the program voltage Vpgm. In the program operation, a program permission voltage (for example, a ground voltage) may be supplied to selected bit lines coupled to selected cell strings, a program inhibition voltage (for example, a power source voltage) may be supplied to unselected bit lines coupled to unselected cell strings. In the state in which the program permission voltage or the program inhibition voltage has been supplied to the bit lines, the program voltage Vpgm which gradually rises may be supplied to a selected word line WLn, and the pass voltage Vpass may be supplied to the remaining unselected word lines WLn−1 to WLn−k and WLn+1 to WLn+k. In the program operation using an ISPP method, the program voltage Vpgm may be raised by a step level. At the early stage of the program operation, a difference between the program voltage Vpgm and a first pass voltage Vpass1 may be smaller than a CD. Accordingly, the program voltage Vpgm which gradually rises may be supplied to the selected word line WLn coupled to selected memory cells Fn, the first pass voltage Vpass having a constant level may be supplied to the remaining unselected word lines WLn−1 to WLn−k and WLn+1 to WLn+k. The CD refers to a maximum voltage difference for preventing the first unselected memory cells Fn−1 and Fn+1 adjacent to the selected memory cells Fn from being erased under the influence of the program voltage Vpgm when the selected memory cells Fn are programmed. The CD may be different according to a semiconductor device and may be calculated by testing the semiconductor device. In the present embodiment, it is assumed, for example only, that the CD is 7.5 V.

If the first program voltage Vpgm supplied to the selected word line WLn is, for example, 12 V and the first pass voltage Vpass1 is, for example, 9 V, a difference between the first program voltage Vpgm and the first pass voltage Vpass1 is 3 V and is lower than the CD. In this case, the first unselected memory cells Fn−1 and Fn+1 adjacent to the selected memory cell Fn are not greatly influenced by the first program voltage Vpgm, and the first pass voltage Vpass1 may be supplied to all the unselected word lines WLn−1 to WLn+k and WLn+1 to WLn+k. That is, when the threshold voltages of the selected memory cells Fn do not reach a target voltage and until a difference between the program voltage Vpgm and the first pass voltage Vpass1 reaches the CD, the program voltage Vpgm may be gradually raised by the step level in proportion to the number of program voltages Vpgm, and the first pass voltage Vpass1 may maintain a constant level.

If the program operation is performed while gradually raising the program voltage Vpgm and a difference between the program voltage Vpgm and the first pass voltage Vpass1 reaches the CD, a second pass voltage Vpass2 which gradually rises may be supplied to the first unselected word lines WLn−1 and WLn+1 adjacent to both ends of the selected word line WLn, and a fourth pass voltage Vpass4 which gradually falls may be supplied to the second unselected word lines WLn−2 and WLn+2 adjacent to the first unselected word lines WLn−1 and WLn+1, respectively. At this time, the first pass voltage Vpass having a constant level may continue to be supplied to the remaining unselected word lines WLn−3 to WLn−k and WLn+3 to WLn+k other than the first unselected word lines WLn−1 and WLn+1 adjacent to the selected word line WLn and the second unselected word lines WLn−2 and WLn+2 adjacent to the first unselected word lines WLn−1 and WLn+1. The second pass voltage Vpass2 may be gradually raised so that a difference between the second pass voltage Vpass2 and the program voltage Vpgm is not higher than the CD. Preferably, in order to prevent the efficiency of the program operation from being deteriorated, the second pass voltage Vpass2 may be gradually raised so that a difference between the second pass voltage Vpass2 and the program voltage Vpgm is equal to the CD. That is, the step-up level of the second pass voltage Vpass2 may be set identically with the step level of the program voltage Vpgm. The fourth pass voltage Vpass4 may be a pulse supplied to the second unselected memory cells Fn−2 and Fn+2 adjacent to the first unselected memory cells Fn−1 and Fn+1, respectively. That is, in order to reduce a decrease in the threshold voltages of the second unselected memory cells Fn−2 and Fn+2 owing to the second pass voltage Vpass2 which gradually rises, the fourth pass voltage Vpass4 gradually falling by a step-down level may be supplied to the second unselected word lines WLn−2 and WLn+2 coupled to the second unselected memory cells Fn−2 and Fn+2. The fourth pass voltage Vpass4 which gradually falls is described below. If the coupling ratio due to a word line coupled to a selected memory cell is, for example, 0.6 and the coupling ratio due to word lines coupled to memory cells adjacent to the selected memory cell is, for example, 0.15, a maximum step-down level of the fourth pass voltage Vpass4 is, for example, 0.5 V×(0.6/0.15)=2 V. Accordingly, it may be preferred that the step-down level of the fourth pass voltage Vpass4 be set within a range higher than the ground voltage 0 V, but lower than 2 V.

The second pass voltage Vpass2 may gradually rise by the step-up level, and the fourth pass voltage Vpass4 may gradually fall by the step-down level. Thus, before the program operation is completed, a difference between the second pass voltage Vpass2 and the fourth pass voltage Vpass4 may reach the CD. If a difference between the second pass voltage Vpass2 and the fourth pass voltage Vpass4 reaches the CD, a fifth pass voltage Vpass5 which gradually rises may be supplied to the second unselected word lines WLn−2 and WLn+2 to which the fourth pass voltage Vpass4 was supplied. That is, when a difference between the second pass voltage Vpass2 and the fourth pass voltage Vpass4 reaches the CD, the threshold voltages of the memory cells Fn−1 and Fn+1 may be decreased by the second pass voltage Vpass2 which gradually rises. In order to prevent the decrease in the threshold voltages of the memory cells Fn−1 and Fn+1, the fifth pass voltage Vpass5 gradually rising by a step-up level may be supplied to the second unselected word lines WLn−2 and WLn+2. When the second or fifth pass voltage Vpass2 or Vpass5 is supplied to the first and the second unselected word lines WLn−1 and WLn+1 and WLn−2 and WLn+2, the first pass voltage Vpass1 having a constant level may continue to be supplied to the remaining unselected word lines WLn−3 to WLn−k and WLn+3 to WLn+k.

As described above, since the pass voltage supplied to the first unselected word lines WLn−1 and WLn+1 adjacent to the selected word line WLn may be made not to exceed the CD, the first unselected memory cells Fn−1 and Fn+1 adjacent to the selected memory cells Fn can be prevented from being erased in the program operation of the selected memory cells Fn. Furthermore, since the pass voltage Vpass supplied to the second and the third unselected word lines WLn−2 and WLn+2 and WLn−3 and WLn+3 is controlled, a shift in the threshold voltages of the first to third unselected memory cells Fn−1 to Fn−3 and Fn+1 to Fn+3 due to the second pass voltage Vpass2 supplied to the first unselected word lines WLn−1 and WLn+1 can be prevented.

Figure 7:
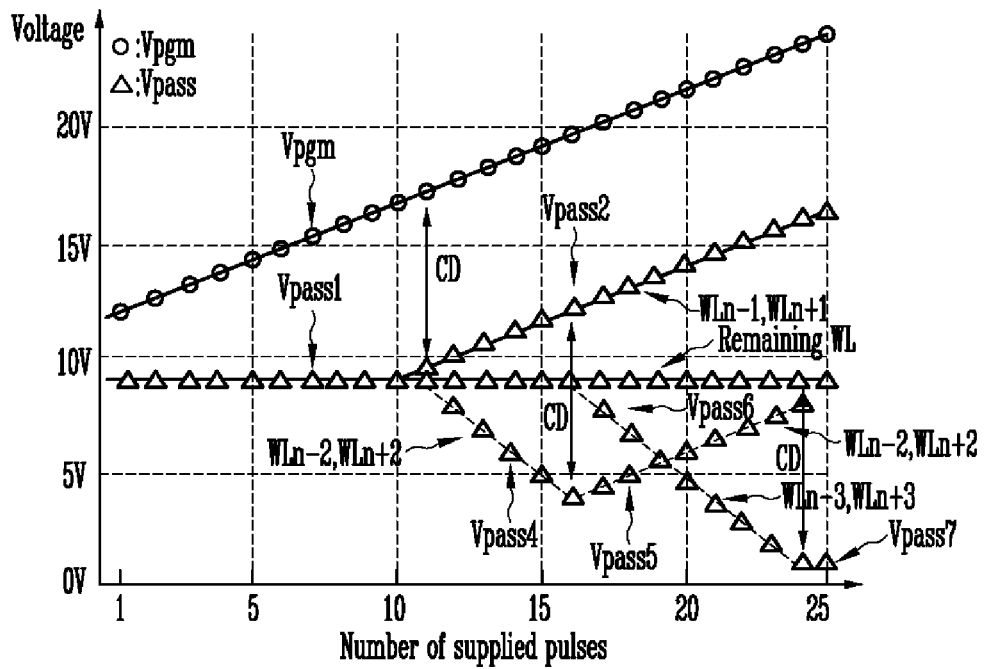
FIG. 7 is a graph illustrating a program method according to a fourth embodiment of this disclosure.

FIG. 7 is a graph illustrating a program method according to a fourth embodiment of this disclosure.

Referring to FIGS. 7 and 3, a program operation may be performed according to an ISPP method of gradually raising the program voltage Vpgm. In the program operation, a program permission voltage (for example, a ground voltage) may be supplied to selected bit lines coupled to selected cell strings, a program inhibition voltage (for example, a power source voltage) may be supplied to unselected bit lines coupled to unselected cell strings. In the state in which the program permission voltage or the program inhibition voltage has been supplied to the bit lines, the program voltage Vpgm which gradually rises may be supplied to a selected word line WLn, and the pass voltage Vpass may be supplied to the remaining unselected word lines WLn−1 to WLn−k and WLn+1 to WLn+k. In the program operation using an ISPP method, the program voltage Vpgm may be raised by a step level. At the early stage of the program operation, a difference between the program voltage Vpgm and a first pass voltage Vpass1 may be smaller than a CD. Accordingly, the program voltage Vpgm which gradually rises may be supplied to the selected word line WLn coupled to selected memory cells Fn, the first pass voltage Vpass having a constant level may be supplied to the remaining unselected word lines WLn−1 to WLn−k and WLn+1 to WLn+k. The CD refers to a maximum voltage difference for preventing the first unselected memory cells Fn−1 and Fn+1 adjacent to the selected memory cells Fn from being erased under the influence of the program voltage Vpgm when the selected memory cells Fn are programmed. The CD may be different according to a semiconductor device and may be calculated by testing the semiconductor device. In the present embodiment, it is assumed, for example only, that the CD is 7.5 V.

If the first program voltage Vpgm supplied to the selected word line WLn is, for example, 12 V and the first pass voltage Vpass1 is, for example, 9 V, a difference between the first program voltage Vpgm and the first pass voltage Vpass1 is 3 V and is lower than the CD. In this case, the first unselected memory cells Fn−1 and Fn+1 adjacent to the selected memory cells Fn are not influenced by the first program voltage Vpgm, and the first pass voltage Vpass1 may be supplied to all the unselected word lines WLn−1 to WLn−k and WLn+1 to WLn+k. That is, when the threshold voltages of the selected memory cells Fn do not reach a target voltage and until a difference between the program voltage Vpgm and the first pass voltage Vpass1 reaches the CD, the program voltage Vpgm may be gradually raised by the step level in proportion to the number of program voltages Vpgm, and the first pass voltage Vpass1 may maintain a constant level.

If the program operation is performed while gradually raising the program voltage Vpgm and a difference between the program voltage Vpgm and the first pass voltage Vpass1 reaches the CD, a second pass voltage Vpass1 which gradually rises may be supplied to the first unselected word lines WLn−1 and WLn+1 adjacent to both ends of the selected word line WLn, and a fourth pass voltage Vpass4 which gradually falls may be supplied to the second unselected word lines WLn−2 and WLn+2 adjacent to the first unselected word lines WLn−1 and WLn+1, respectively. At this time, the first pass voltage Vpass having a constant level may continue to be supplied to the remaining unselected word lines WLn31 3 to WLn−k and WLn+3 to WLn+k other than the first unselected word lines WLn−1 and WLn+1 adjacent to the selected word line WLn and the second unselected word lines WLn−2 and WLn+2 adjacent to the first unselected word lines WLn−1 and WLn+1.

The second pass voltage Vpass2 may be gradually raised so that a difference between the second pass voltage Vpass2 and the program voltage Vpgm is not higher than the CD. Preferably, in order to prevent the efficiency of the program operation from being deteriorated, the second pass voltage Vpass2 may be gradually raised so that a difference between the second pass voltage Vpass2 and the program voltage Vpgm is substantially equal to the CD. That is, the step-up level of the second pass voltage Vpass2 may be set identically or substantially the same with the step level of the program voltage Vpgm. The fourth pass voltage Vpass4 may be a pulse supplied to the second unselected memory cells Fn−2 and Fn+2 adjacent to the first unselected memory cells Fn−1 and Fn+1, respectively, to which the second pass voltage Vapss2 may be supplied. That is, in order to reduce a decrease in the threshold voltages of the second unselected memory cells Fn−2 and Fn+2 owing to the second pass voltage Vpass2 which gradually rises, the fourth pass voltage Vpass4 which gradually falls may be supplied to the second unselected word lines WLn−2 and WLn+2 coupled to the second unselected memory cells Fn−2 and Fn+2. It may be preferred that the step-down level of the fourth pass voltage Vpass4 be set within a range of, for example, 0 V to −2 V.

The second pass voltage Vpass2 may gradually rise, and the fourth pass voltage Vpass4 may gradually fall. Thus, before the program operation is completed, a difference between the second pass voltage Vpass2 and the fourth pass voltage Vpass4 may reach the CD. From this time, a fifth pass voltage Vpass5 which gradually rises may be supplied to the second unselected word lines WLn31 2 and WLn+2 to which the fourth pass voltage Vpass4 was supplied, and a sixth pass voltage Vpass6 which gradually falls may be supplied to the third unselected word lines WLn−3 and WLn+3 adjacent to the second unselected word lines WLn−2 and WLn+2. That is, when a difference between the second pass voltage Vpass2 and the fourth pass voltage Vpass4 is at the CD or higher, the threshold voltages of the first unselected memory cells Fn−1 and Fn+1 may decrease owing to the second pass voltage Vpass2 which gradually rises. In order to prevent the rise, the fifth pass voltage Vpass5 which gradually rise may be supplied to the second unselected word lines WLn31 2 and WLn+2. When the second, the fifth, and the sixth pass voltages Vpass2, Vpass5, and Vpass6 are supplied to the first to third unselected word lines WLn−1 to WLn−3 and WLn+1 to WLn+3 which are sequentially adjacent to the selected word line WLn, the first pass voltage Vpass1 having a constant level may continue to be supplied to the remaining unselected word lines WLn−4 to WLn−k and WLn+4 to WLn+k.

If the sixth pass voltage Vpass6 which gradually falls is supplied to the third unselected word lines WLn−3 and WLn+3, a difference between the sixth pass voltage Vpass6 and the first pass voltage Vpass1 may reach the CD. From this time, in order to prevent a voltage difference between the third unselected word lines WLn−3 and WLn+3 and the fourth word lines WLn−4 and WLn+4 from further increasing, a seventh pass voltage Vpass7, having a constant level and being equal to the sixth pass voltage Vpass6, may be supplied to the third unselected word lines WLn−3 and WLn+3.

As described above, since the pass voltages supplied to the first to third unselected word lines WLn−1 to WLn−3 and WLn+1 to WLn+3 adjacent to the selected word line WLn are controlled, a shift in the threshold voltages of the first to third memory cells Fn−1 to Fn−3 and Fn+1 to Fn+3 adjacent to the selected memory cells Fn in the program operation of the selected memory cells Fn can be prevented.

Figure 8:
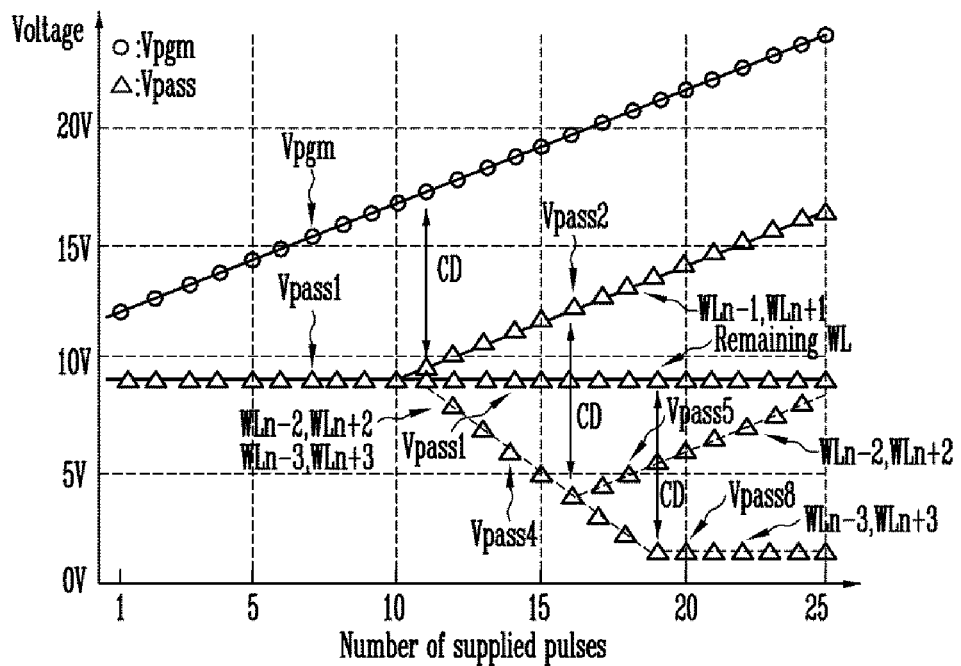
FIG. 8 is a graph illustrating a program method according to a fifth embodiment of this disclosure.

FIG. 8 is a graph illustrating a program method according to a fifth embodiment of this disclosure.

Referring to FIGS. 8 and 3, a program operation is performed according to an ISPP method of gradually raising the program voltage Vpgm. In the program operation, a program permission voltage (for example, a ground voltage) may be supplied to selected bit lines coupled to selected cell strings, a program inhibition voltage (for example, a power source voltage) may be supplied to unselected bit lines coupled to unselected cell strings. In the state in which the program permission voltage or the program inhibition voltage has been supplied to the bit lines, the program voltage Vpgm which gradually rises may be supplied to a selected word line WLn, and the pass voltage Vpass may be supplied to the remaining unselected word lines WLn−1 to WLn−k and WLn+1 to WLn+k. In the program operation using an ISPP method, the program voltage Vpgm may be raised by a step level. At the early stage of the program operation, a difference between the program voltage Vpgm and a first pass voltage Vpass1 is smaller than a CD. Accordingly, the program voltage Vpgm which gradually rises may be supplied to the selected word line WLn coupled to selected memory cells Fn, the first pass voltage Vpass having a constant level may be supplied to the remaining unselected word lines WLn−1 to WLn−k and WLn+1 to WLn+k. The CD refers to a maximum voltage difference for preventing the first unselected memory cells Fn−1 and Fn+1 adjacent to the selected memory cells Fn from being erased under the influence of the program voltage Vpgm when the selected memory cells Fn are programmed. The CD may be different according to a semiconductor device and may be calculated by testing the semiconductor device. In the present embodiment, it is assumed, for example only, that the CD is 7.5 V.

If the first program voltage Vpgm supplied to the selected word line WLn is, for example, 12 V and the first pass voltage Vpass1 is, for example, 9 V, a difference between the first program voltage Vpgm and the first pass voltage Vpass1 is 3 V and is lower than the CD. In this case, the first unselected memory cells Fn−1 and Fn+1 adjacent to the selected memory cells Fn are not influenced by the first program voltage Vpgm, and the first pass voltage Vpass1 may be supplied to all the unselected word lines WLn31 1 to WLn−k and WLn+1 to WLn+k. That is, when the threshold voltages of the selected memory cells Fn do not reach a target voltage and until a difference between the program voltage Vpgm and the first pass voltage Vpass1 reaches the CD, the program voltage Vpgm may be gradually raised by the step level in proportion to the number of program voltages Vpgm, and the first pass voltage Vpass1 may maintain a constant level.

If the program operation is performed while gradually raising the program voltage Vpgm and a difference between the program voltage Vpgm and the first pass voltage Vpass1 reaches the CD, a second pass voltage Vpass2 which gradually rises may be supplied to the first unselected word lines WLn−1 and WLn+1 adjacent to both ends of the selected word line WLn and, at the same time, a fourth pass voltage Vpass4 which gradually falls may be supplied to the second and the third unselected word lines WLn−2 and WLn+2 and WLn−3 and WLn+3. At this time, the first pass voltage Vpass having a constant level continues to be supplied to the remaining unselected word lines WLn−3 to WLn−k and WLn+3 to WLn+k other than the first unselected word lines WLn−1 and WLn+1 adjacent to the selected word line WLn and the second unselected word lines WLn−2 and WLn+2 adjacent to the first unselected word lines WLn−1 and WLn+1.

The second pass voltage Vpass2 may be gradually raised so that a difference between the second pass voltage Vpass2 and the program voltage Vpgm is not higher than the CD. Preferably, in order to prevent the efficiency of the program operation from being deteriorated, the second pass voltage Vpass2 may be gradually raised so that a difference between the second pass voltage Vpass2 and the program voltage Vpgm is equal or substantially equal to the CD. That is, the step-up level of the second pass voltage Vpass2 may be set identically with the step level of the program voltage Vpgm. That is, in order to reduce a decrease in the threshold voltages of the second and the third unselected memory cells Fn−2 and Fn+2 and Fn−3 and Fn+3 owing to the second pass voltage Vpass2 which gradually rises, the fourth pass voltage Vpass4 which gradually falls may be supplied to the second and the third unselected word lines WLn−2 and WLn+2 and WLn−3 and WLn+3 coupled to the second and the third unselected memory cells Fn−2 and Fn+2 and Fn−3 and Fn+3. It may be preferred that the step-down level of the fourth pass voltage Vpass4 be set within a range of 0 V to −2 V.

The second pass voltage Vpass2 may gradually rise, and the fourth pass voltage Vpass4 may gradually fall. Thus, before the program operation is completed, a difference between the second pass voltage Vpass2 and the fourth pass voltage Vpass4 may reach the CD. From this time, a fifth pass voltage Vpass5 which gradually rises may be supplied to the second unselected word lines WLn−2 and WLn+2 to which the fourth pass voltage Vpass4 was supplied, and the fourth pass voltage Vpass4 which gradually falls may continue to be supplied to the third unselected word lines WLn31 3 and WLn+3. That is, the second unselected memory cells Fn−2 and Fn+2 are more influenced by the second pass voltage Vpass2, supplied to the first unselected word lines WLn31 1 and WLn+1, than the second unselected memory cells Fn−3 and Fn+3. Accordingly, the influence of the second pass voltage Vpass2 may be reduced by raising the potentials of the second unselected word lines WLn−2 and WLn+2 coupled to the second unselected memory cells Fn−2 and Fn+2. At this time, the first pass voltage Vpass1 having a constant level continues to be supplied to the remaining unselected word lines WLn−4 to WLn−k and WLn+4 to WLn+k.

If the fourth pass voltage Vpass4 supplied to the third unselected word lines WLn−3 and WLn+3 drops and thus a difference between the fourth pass voltage Vpass4 and the first pass voltage Vpass1 reaches the CD, an eighth pass voltage Vpass8 having a constant level may be supplied to the third unselected word lines WLn−3 and WLn+3.

As described above, since the pass voltages supplied to the first to third unselected word lines WLn−1 to WLn−3 and WLn+1 to WLn+3 adjacent to the selected word line WLn are controlled, a shift in the threshold voltages of the first to third memory cells Fn−1 to Fn−3 and Fn+1 to Fn+3 adjacent to the selected memory cells Fn in the program operation of the selected memory cells Fn can be prevented.

Figure 9:
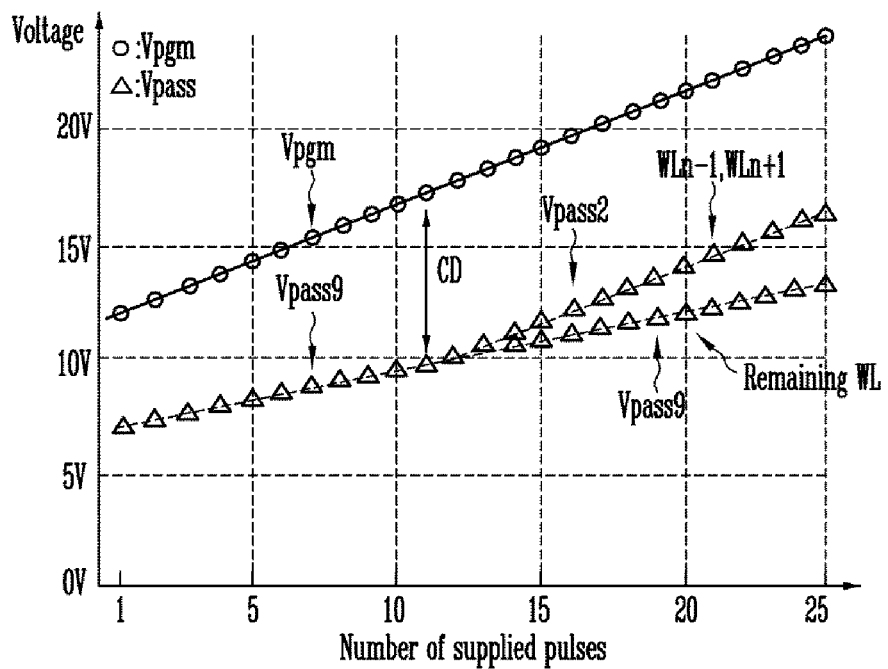
FIG. 9 is a graph illustrating a program method according to a sixth embodiment of this disclosure.

FIG. 9 is a graph illustrating a program method according to a sixth embodiment of this disclosure.

Referring to FIGS. 9 and 3, a program operation may be performed according to an ISPP method of gradually raising the program voltage Vpgm. In the program operation, a program permission voltage (for example, a ground voltage) may be supplied to selected bit lines coupled to selected cell strings, a program inhibition voltage (for example, a power source voltage) may be supplied to unselected bit lines coupled to unselected cell strings. In the state in which the program permission voltage or the program inhibition voltage has been supplied to the bit lines, the program voltage Vpgm which gradually rises may be supplied to a selected word line WLn, and the pass voltage Vpass may be supplied to the remaining unselected word lines WLn−1 to WLn−k and WLn+1 to WLn+k. In the program operation using an ISPP method, the program voltage Vpgm may be raised by a step level. In the program operation, the program voltage Vpgm gradually rising by the step level may be supplied to the selected word line WLn, and a ninth pass voltage Vpass9 may be supplied to the remaining unselected word lines WLn−1 to WLn−k and WLn+1 to WLn+k. The ninth pass voltage Vpass9 may be gradually raised by a level which is lower than the step level of the program voltage Vpgm. That is, an increment of the ninth pass voltage Vpass9 may be smaller than an increment of the program voltage Vpgm. The reason why the ninth pass voltage Vpass9 which gradually rises is supplied to the unselected word lines WLn−1 to WLn−k and WLn+1 to WLn+k as described above is to prevent the unselected memory cells of the unselected cell string ST from being erased owing to the program voltage Vpgm which gradually rises. That is, since the program inhibition voltage Vcc is supplied to bit lines coupled to the unselected cell strings, channel boosting is generated due to the program inhibition voltage and the voltage supplied to the word lines WLn−k to WLn+k. At this time, when a gradually rising voltage, such as the ninth pass voltage Vpass9, is supplied, channel boosting may be further efficiently generated, thereby being capable of raising the potential of a channel.

At the early stage of the program operation, a difference between the program voltage Vpgm and the ninth pass voltage Vpass9 may be smaller than a CD. Accordingly, the program voltage Vpgm which gradually rises may be supplied to the selected word line WLn coupled to selected memory cells Fn, the ninth pass voltage Vpass9 which gradually rises may also be supplied to the remaining unselected word lines WLn−1 to WLn−k and WLn+1 to WLn+k. Here, an increment of the ninth pass voltage Vpass9 may be smaller than an increment of the program voltage Vpgm. The CD refers to a maximum voltage difference for preventing the first unselected memory cells Fn−1 and Fn+1 adjacent to the selected memory cells Fn from being erased under the influence of the program voltage Vpgm when the selected memory cells Fn are programmed. The CD may be different according to a semiconductor device and may be calculated by testing the semiconductor device. In the present embodiment, it is assumed, for example only, that the CD is 7.5 V.

If the first program voltage Vpgm supplied to the selected word line WLn is, for example, 12 V and the ninth pass voltage Vpass9 is, for example, 7 V, a difference between the first program voltage Vpgm and the ninth pass voltage Vpass9 is 5 V and is lower than the CD. In this case, the first unselected memory cells Fn−1 and Fn+1 adjacent to the selected memory cells Fn are not greatly influenced by the program voltage Vpgm, and thus the ninth pass voltage Vpass9 may be supplied to all the unselected word lines WLn−1 to WLn−k and WLn+1 to WLn+k. That is, when the threshold voltages of the selected memory cells Fn do not reach a target voltage and until a difference between the program voltage Vpgm and the ninth pass voltage Vpass9 reaches the CD, the program voltage Vpgm may be gradually raised by the step level in proportion to the number of program voltages Vpgm, and the ninth pass voltage Vpass9 may be gradually raised by a level lower than the program voltage Vpgm.

If the program operation is performed while gradually raising the program voltage Vpgm and the ninth pass voltage Vpass9 and a difference between the program voltage Vpgm and the ninth pass voltage Vpass9 reaches the CD, a second pass voltage Vpass2 rising faster than the ninth pass voltage Vpass9 may be supplied to the first unselected word lines WLn−1 and WLn+1 adjacent to both ends of the selected word line WLn. At this time, the ninth pass voltage Vpass9 may continue to be supplied to the remaining unselected word lines WLn−2 to WLn−k and WLn+2 to WLn+k other than the first unselected word lines WLn−1 and WLn+1. The second pass voltage Vpass2 may be gradually raised so that a difference between the second pass voltage Vpass2 and the program voltage Vpgm is not higher than the CD. Preferably, the second pass voltage Vpass2 is gradually raised so that a difference between the second pass voltage Vpass2 and the program voltage Vpgm maintains the CD by taking the efficiency of the program operation into consideration. That is, the step-up level of the second pass voltage Vpass2 may be set identically with the step level of the program voltage Vpgm. For example, if the step level of the program voltage Vpgm is 0.5 V, the second pass voltage Vpass2 may also be gradually raised by 0.5 V.

As described above, since the pass voltage supplied to the first unselected word lines WLn−1 and WLn+1 adjacent to the selected word line WLn may be made lower than the CD, the threshold voltages of the first unselected memory cells Fn−1 and Fn+1 adjacent to the selected memory cell Fn can be prevented from decreasing in the program operation of the selected memory cell Fn.

Figure 10:
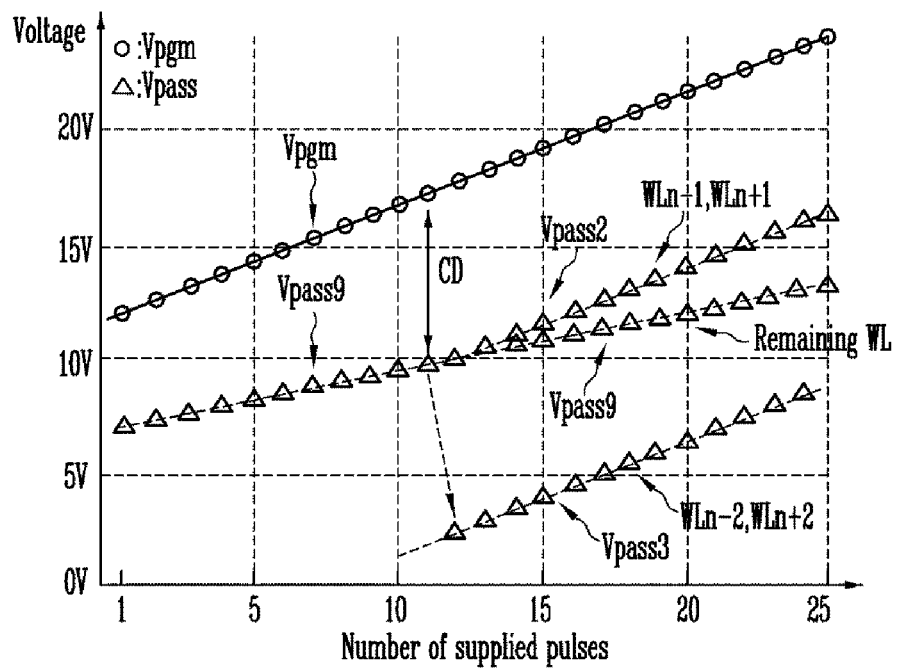
FIG. 10 is a graph illustrating a program method according to a seventh embodiment of this disclosure.

FIG. 10 is a graph illustrating a program method according to a seventh embodiment of this disclosure.

Referring to FIGS. 10 and 3, a program operation may be performed according to an ISPP method of gradually raising the program voltage Vpgm. In the program operation, a program permission voltage (for example, a ground voltage) may be supplied to selected bit lines coupled to selected cell strings, a program inhibition voltage (for example, a power source voltage) may be supplied to unselected bit lines coupled to unselected cell strings. In the state in which the program permission voltage or the program inhibition voltage has been supplied to the bit lines, the program voltage Vpgm which gradually rises may be supplied to a selected word line WLn, and the pass voltage Vpass may be supplied to the remaining unselected word lines WLn−1 to WLn−k and WLn+1 to WLn+k. In the program operation using an ISPP method, the program voltage Vpgm may be raised by a step level. In the program operation, the program voltage Vpgm gradually rising by the step level may be supplied to the selected word line WLn, and a ninth pass voltage Vpass9 may be supplied to the remaining unselected word lines WLn−1 to WLn−k and WLn+1 to WLn+k. Here, an increment of the ninth pass voltage Vpass9 is smaller than an increment of the program voltage Vpgm. The reason why the ninth pass voltage Vpass9 which gradually rises is supplied to the unselected word lines WLn−1 to WLn−k and WLn+1 to WLn+k as described above is to prevent the unselected memory cells of the unselected cell string ST from being erased owing to the program voltage Vpgm which gradually rises. That is, since the program inhibition voltage Vcc may be supplied to bit lines coupled to the unselected cell strings, channel boosting may be generated due to the program inhibition voltage and the voltage supplied to the word lines WLn−k to WLn+k. At this time, when a gradually rising voltage, such as the ninth pass voltage Vpass9, is supplied, channel boosting may be further efficiently generated, thereby being capable of raising the potential of a channel.

At the early stage of the program operation, a difference between the program voltage Vpgm and the ninth pass voltage Vpass9 may be smaller than a CD. Accordingly, the program voltage Vpgm which gradually rises may be supplied to the selected word line WLn coupled to selected memory cells Fn, the ninth pass voltage Vpass9 which gradually rises may also be supplied to the remaining unselected word lines WLn−1 to WLn−k and WLn+1 to WLn+k. Here, an increment of the ninth pass voltage Vpass9 may be smaller than an increment of the program voltage Vpgm. The CD refers to a maximum voltage difference for preventing the first unselected memory cells Fn−1 and Fn+1 adjacent to the selected memory cells Fn from being erased under the influence of the program voltage Vpgm when the selected memory cells Fn are programmed. The CD may be different according to a semiconductor device and may be calculated by testing the semiconductor device. In the present embodiment, it is assumed that, for example only, the CD is 7.5 V.

If the first program voltage Vpgm supplied to the selected word line WLn is, for example, 12 V and the ninth pass voltage Vpass9 is, for example, 7 V, a difference between the first program voltage Vpgm and the ninth pass voltage Vpass9 is 5 V and is lower than the CD. In this case, the first unselected memory cells Fn−1 and Fn+1 adjacent to the selected memory cells Fn are not greatly influenced by the program voltage Vpgm, and thus the ninth pass voltage Vpass9 may be supplied to all the unselected word lines WLn−1 to WLn−k and WLn+1 to WLn+k. That is, when the threshold voltages of the selected memory cells Fn do not reach a target voltage and until a difference between the program voltage Vpgm and the ninth pass voltage Vpass9 reaches the CD, the program voltage Vpgm may be gradually raised by the step level in proportion to the number of program voltages Vpgm, and the ninth pass voltage Vpass9 may be gradually raised by a level lower than the program voltage Vpgm.

If the program operation is performed while gradually raising the program voltage Vpgm and the ninth pass voltage Vpass9 and a difference between the program voltage Vpgm and the ninth pass voltage Vpass9 reaches the CD, a second pass voltage Vpass2 which gradually rises may be supplied to the first unselected word lines WLn−1 and WLn+1 adjacent to both ends of the selected word line WLn, and a third pass voltage Vpass3 lower than the first pass voltage Vpass1 by the CD may be supplied to the second unselected word lines WLn−2 and WLn+2 adjacent to the first unselected word lines WLn−1 and WLn+1. At this time, the ninth pass voltage Vpass9 continues to be supplied to the remaining unselected word lines WLn−3 to WLn−k and WLn+3 to WLn+k other than the first unselected word lines WLn−1 and WLn+1 and the second unselected word lines WLn−2 and WLn+2. The second pass voltage Vpass2 may be gradually raised so that a difference between the second pass voltage Vpass2 and the program voltage Vpgm is not higher than the CD. Preferably, the second pass voltage Vpass2 may be gradually raised so that a difference between the second pass voltage Vpass2 and the program voltage Vpgm maintains the CD by taking the efficiency of the program operation into consideration. That is, the step-up level of the second pass voltage Vpass2 may be set identically with the step level of the program voltage Vpgm. The third pass voltage Vpass3 may be a pulse supplied to the second unselected memory cells Fn−2 and Fn+2 adjacent to the first unselected memory cells Fn−1 and Fn+1, respectively, to which the second pass voltage Vapss2 is supplied. That is, in order to prevent the threshold voltages of the second unselected memory cells Fn−2 and Fn+2 from decreasing under the influence of the second pass voltage Vpass2 which gradually rises, the level of the ninth pass voltage Vpass9 supplied to the second unselected word lines WLn−2 and WLn+2 coupled to the second unselected memory cells Fn−2 and Fn+2, respectively, may be lowered by the CD, and the third pass voltage Vpass3 which gradually rises is supplied to. For example, if the step level of the program voltage Vpgm is 0.5 V, the second pass voltage Vpass2 and the third pass voltage Vpass3 may also be gradually raised by 0.5 V.

As described above, since the pass voltage supplied to the first unselected word lines WLn−1 and WLn+1 adjacent to the selected word line WLn is made lower than the CD, the threshold voltages of the first unselected memory cells Fn−1 and Fn+1 adjacent to the selected memory cell Fn can be prevented from decreasing in the program operation of the selected memory cell Fn. Furthermore, after the second pass voltage Vpass2 is supplied, the third pass voltage Vpass3 lower than the second pass voltage Vapss2 by the CD may be supplied to the second unselected word lines WLn−2 and WLn+2. Accordingly, the threshold voltages of the second unselected memory cells Fn−2 and Fn+2 adjacent to the first unselected memory cells Fn−1 and Fn+1 can be prevented from decreasing.

Figure 11:
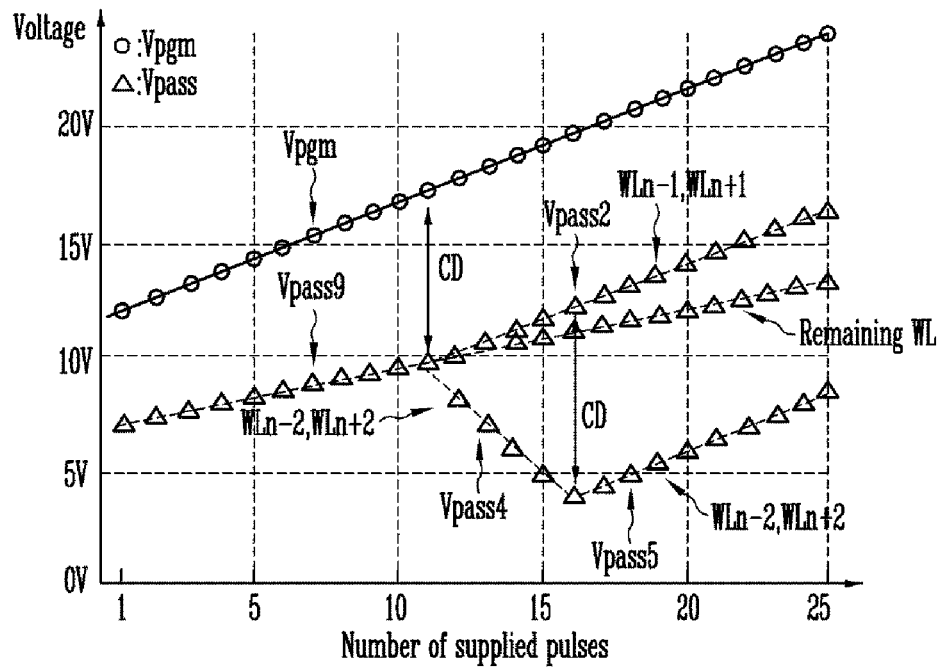
FIG. 11 is a graph illustrating a program method according to an eighth embodiment of this disclosure.

FIG. 11 is a graph illustrating a program method according to an eighth embodiment of this disclosure.

Referring to FIGS. 11 and 3, a program operation may be performed according to an ISPP method of gradually raising the program voltage Vpgm. In the program operation, a program permission voltage (for example, a ground voltage) may be supplied to selected bit lines coupled to selected cell strings, a program inhibition voltage (for example, a power source voltage) may be supplied to unselected bit lines coupled to unselected cell strings. In the state in which the program permission voltage or the program inhibition voltage has been supplied to the bit lines, the program voltage Vpgm which gradually rises may be supplied to a selected word line WLn, and the pass voltage Vpass may be supplied to the remaining unselected word lines WLn−1 to WLn−k and WLn+1 to WLn+k. In the program operation using an ISPP method, the program voltage Vpgm may be raised by a step level. In the program operation, the program voltage Vpgm gradually rising by the step level may be supplied to the selected word line WLn, and a ninth pass voltage Vpass9 may be supplied to the remaining unselected word lines WLn−1 to WLn−k and WLn+1 to WLn+k. The ninth pass voltage Vpass9 may be gradually raised by a level which is lower than the step level of the program voltage Vpgm. That is, an increment of the ninth pass voltage Vpass9 is smaller than an increment of the program voltage Vpgm. The reason why the ninth pass voltage Vpass9 which gradually rises is supplied to the unselected word lines WLn−1 to WLn−k and WLn+1 to WLn+k as described above is to prevent the unselected memory cells of the unselected cell string ST from being erased owing to the program voltage Vpgm which gradually rises. That is, since the program inhibition voltage Vcc may be supplied to bit lines coupled to the unselected cell strings, channel boosting may be generated due to the program inhibition voltage and the voltage supplied to the word lines WLn−k to WLn+k. At this time, when a gradually rising voltage, such as the ninth pass voltage Vpass9, is supplied, channel boosting may be further efficiently generated, thereby being capable of raising the potential of a channel.

At the early stage of the program operation, a difference between the program voltage Vpgm and the ninth pass voltage Vpass9 may be smaller than a CD. Accordingly, the program voltage Vpgm which gradually rises may be supplied to the selected word line WLn coupled to selected memory cells Fn, the ninth pass voltage Vpass9 which gradually rises may also be supplied to the remaining unselected word lines WLn−1 to WLn−k and WLn+1 to WLn+k. Here, an increment of the ninth pass voltage Vpass9 may be smaller than an increment of the program voltage Vpgm. The CD refers to a maximum voltage difference for preventing the first unselected memory cells Fn−1 and Fn+1 adjacent to the selected memory cells Fn from being erased under the influence of the program voltage Vpgm when the selected memory cells Fn are programmed. The CD may be different according to a semiconductor device and may be calculated by testing the semiconductor device. In the present embodiment, it is assumed that the CD is, for example, 7.5 V.

If the first program voltage Vpgm supplied to the selected word line WLn is, for example, 12 V and the ninth pass voltage Vpass9 is, for example, 7 V, a difference between the first program voltage Vpgm and the ninth pass voltage Vpass9 is 5 V and is lower than the CD. In this case, the first unselected memory cells Fn−1 and Fn+1 adjacent to the selected memory cells Fn are not greatly influenced by the program voltage Vpgm, and thus the ninth pass voltage Vpass9 may be supplied to all the unselected word lines WLn−1 to WLn−k and WLn+1 to WLn+k. That is, when the threshold voltages of the selected memory cells Fn do not reach a target voltage and until a difference between the program voltage Vpgm and the ninth pass voltage Vpass9 reaches the CD, the program voltage Vpgm may be gradually raised by the step level in proportion to the number of program voltages Vpgm, and the ninth pass voltage Vpass9 may be gradually raised by a level lower than the program voltage Vpgm.

If the program operation is performed while gradually raising the program voltage Vpgm and the ninth pass voltage Vpass9 and a difference between the program voltage Vpgm and the ninth pass voltage Vpass9 reaches the CD, a second pass voltage Vpass2 which gradually rises may be supplied to the first unselected word lines WLn−1 and WLn+1 adjacent to both ends of the selected word line WLn, and a fourth pass voltage Vpass4 which gradually falls may be supplied to the second unselected word lines WLn−2 and WLn+2 adjacent to the first unselected word lines WLn−1 and WLn+1. At this time, the ninth pass voltage Vpass9 continues to be supplied to the remaining unselected word lines WLn−3 to WLn−k and WLn+3 to WLn+k other than the first unselected word lines WLn−1 and WLn+1 adjacent to the selected word line WLn and the second unselected word lines WLn−2 and WLn+2 adjacent to the first unselected word lines WLn−1 and WLn+1. The second pass voltage Vpass2 may be gradually raised so that a difference between the second pass voltage Vpass2 and the program voltage Vpgm is not higher than the CD. In order to prevent the efficiency of the program operation from being deteriorated, the second pass voltage Vpass2 preferably is gradually raised so that a difference between the second pass voltage Vpass2 and the program voltage Vpgm maintains the CD. That is, the step-up level of the second pass voltage Vpass2 may be set identically with the step level of the program voltage Vpgm. The fourth pass voltage Vpass4 may be a pulse supplied to the second unselected memory cells Fn−2 and Fn+2 adjacent to the first unselected memory cells Fn−1 and Fn+1, respectively. That is, in order to reduce a decrease in the threshold voltages of the second unselected memory cells Fn−2 and Fn+2 under the influence of the second pass voltage Vpass2 which gradually rises, the fourth pass voltage Vpass4 gradually falling by the step-down level may be supplied to the second unselected word lines WLn−2 and WLn+2 coupled to the second unselected memory cells Fn−and Fn+2. The fourth pass voltage Vpass4 which gradually falls is described below. If the coupling ratio due to a word line coupled to a selected memory cell is, for example, 0.6 and the coupling ratio due to word lines coupled to memory cells adjacent to the selected memory cell is, for example, 0.15, a maximum step-down level of the fourth pass voltage Vpass4 may be 0.5 V×(0.6/0.15)=2 V. Accordingly, it may be preferred that the step-down level of the fourth pass voltage Vpass4 be set within a range higher than the ground voltage 0 V, but lower than 2 V.

The second pass voltage Vpass2 may gradually rise by the step-up level, and the fourth pass voltage Vpass4 may gradually fall by the step-down level. Thus, before the program operation is completed, a difference between the second pass voltage Vpass2 and the fourth pass voltage Vpass4 may reach the CD. If a difference between the second pass voltage Vpass2 and the fourth pass voltage Vpass4 is much greater than the CD, a fifth pass voltage Vpass5 which gradually rises may be supplied to the second unselected word lines WLn−2 and WLn+2 to which the fourth pass voltage Vpass4 was supplied. That is, when a difference between the second pass voltage Vpass2 and the fourth pass voltage Vpass4 reaches the CD, the threshold voltages of the memory cells Fn−1 and Fn+1 may be decrease by the second pass voltage Vpass2 which gradually rises. In order to prevent the decrease in the threshold voltages of the memory cells Fn−1 and Fn+1, the fifth pass voltage Vpass5 gradually rising by a step-up level may be supplied to the second unselected word lines WLn−2 and WLn+2. When the second or fifth pass voltage Vpass2 or Vpass5 is supplied to the first and the second unselected word lines WLn−1, WLn+1 and WLn−2, WLn+2, the ninth pass voltage Vpass9 may continue to be supplied to the remaining unselected word lines WLn−3 to WLn−k and WLn+3 to WLn+k.

As described above, since the pass voltage supplied to the first unselected word lines WLn−1 and WLn+1 adjacent to the selected word line WLn may be made not to exceed the CD, the first unselected memory cells Fn−1 and Fn+1 adjacent to the selected memory cells Fn can be prevented from being erased in the program operation of the selected memory cells Fn. Furthermore, since the pass voltage Vpass supplied to the second and the third unselected word lines WLn−2 and WLn+2 and WLn−3 and WLn+3 may be controlled, a shift in the threshold voltages of the first to third unselected memory cells Fn−1 to Fn−3 and Fn+1 to Fn+3 due to the second pass voltage Vpass2 supplied to the first unselected word lines WLn−1 and WLn+1 can be prevented.

Figure 12:
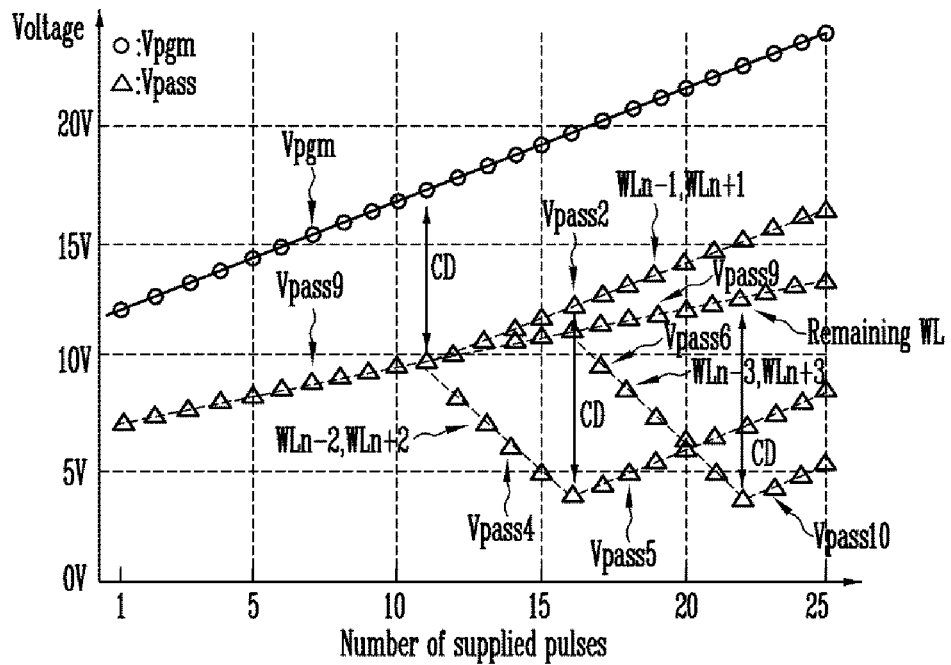
FIG. 12 is a graph illustrating a program method according to a ninth embodiment of this disclosure.

FIG. 12 is a graph illustrating a program method according to a ninth embodiment of this disclosure.

Referring to FIGS. 12 and 3, a program operation may be performed according to an ISPP method of gradually raising the program voltage Vpgm. In the program operation, a program permission voltage (for example, a ground voltage) may be supplied to selected bit lines coupled to selected cell strings, a program inhibition voltage (for example, a power source voltage) may be supplied to unselected bit lines coupled to unselected cell strings. In the state in which the program permission voltage or the program inhibition voltage has been supplied to the bit lines, the program voltage Vpgm which gradually increases may be supplied to a selected word line WLn, and the pass voltage Vpass may be supplied to the remaining unselected word lines WLn−1 to WLn−k and WLn+1 to WLn+k. In the program operation using an ISPP method, the program voltage Vpgm may be raised by a step level. In the program operation, the program voltage Vpgm gradually increasing by the step level may be supplied to the selected word line WLn, and a ninth pass voltage Vpass9 may be supplied to the remaining unselected word lines WLn−1 to WLn−k and WLn+1 to WLn+k. The ninth pass voltage Vpass9 may be gradually raised by a level which is lower than the step level of the program voltage Vpgm. That is, an increment of the ninth pass voltage Vpass9 may be smaller than an increment of the program voltage Vpgm. The reason why the ninth pass voltage Vpass9 which gradually rises is supplied to the unselected word lines WLn31 1 to WLn−k and WLn+1 to WLn+k as described above may be to prevent the unselected memory cells of the unselected cell string ST from being erased owing to the program voltage Vpgm which gradually rises. That is, since the program inhibition voltage Vcc may be supplied to bit lines coupled to the unselected cell strings, channel boosting may be generated due to the program inhibition voltage and the voltage supplied to the word lines WLn−k to WLn+k. At this time, when a gradually rising voltage, such as the ninth pass voltage Vpass9, is supplied, channel boosting may be further efficiently generated, thereby being capable of raising the potential of a channel.

At the early stage of the program operation, a difference between the program voltage Vpgm and the ninth pass voltage Vpass9 may be smaller than a CD. Accordingly, the program voltage Vpgm which gradually rises may be supplied to the selected word line WLn coupled to selected memory cells Fn, the ninth pass voltage Vpass9 which gradually rises may also be supplied to the remaining unselected word lines WLn31 1 to WLn−k and WLn+1 to WLn+k. Here, an increment of the ninth pass voltage Vpass9 may be smaller than an increment of the program voltage Vpgm. The CD refers to a maximum voltage difference for preventing the first unselected memory cells Fn−1 and Fn+1 adjacent to the selected memory cells Fn from being erased under the influence of the program voltage Vpgm when the selected memory cells Fn are programmed. The CD may be different according to a semiconductor device and may be calculated by testing the semiconductor device. In the present embodiment, it is assumed, for example only, that the CD is 7.5 V.

If the first program voltage Vpgm supplied to the selected word line WLn is, for example, 12 V and the ninth pass voltage Vpass9 is, for example, 7 V, a difference between the first program voltage Vpgm and the ninth pass voltage Vpass9 is 5 V and is lower than the CD. In this case, the first unselected memory cells Fn−1 and Fn+1 adjacent to the selected memory cells Fn are not greatly influenced by the program voltage Vpgm, and thus the ninth pass voltage Vpass9 may be supplied to all the unselected word lines WLn−1 to WLn−k and WLn+1 to WLn+k. That is, when the threshold voltages of the selected memory cells Fn do not reach a target voltage and until a difference between the program voltage Vpgm and the ninth pass voltage Vpass9 reaches the CD, the program voltage Vpgm may be gradually raised by the step level in proportion to the number of program voltages Vpgm, and the ninth pass voltage Vpass9 may be gradually raised by a level lower than the program voltage Vpgm.

If the program operation is performed while gradually raising the program voltage Vpgm and the ninth pass voltage Vpass9 and a difference between the program voltage Vpgm and the ninth pass voltage Vpass9 reaches the CD, a second pass voltage Vpass2 which gradually rises may be supplied to the first unselected word lines WLn−1 and WLn+1 adjacent to both ends of the selected word line WLn, and a fourth pass voltage Vpass4 which gradually falls may be supplied to the second unselected word lines WLn−2 and WLn+2 adjacent to the first unselected word lines WLn−1 and WLn+1. At this time, the ninth pass voltage Vpass9 continues to be supplied to the remaining unselected word lines WLn−3 to WLn−k and WLn+3 to WLn+k other than the first unselected word lines WLn−1 and WLn+1 adjacent to the selected word line WLn and the second unselected word lines WLn−2 and WLn+2 adjacent to the first unselected word lines WLn−1 and WLn+1.

The second pass voltage Vpass2 may be gradually raised so that a difference between the second pass voltage Vpass2 and the program voltage Vpgm is not higher than the CD. In order to prevent the efficiency of the program operation from being deteriorated, the second pass voltage Vpass2 preferably is gradually raised so that a difference between the second pass voltage Vpass2 and the program voltage Vpgm maintains the CD. That is, the step-up level of the second pass voltage Vpass2 may be set identically or substantially the same with the step level of the program voltage Vpgm. The fourth pass voltage Vpass4 may be a pulse supplied to the second unselected memory cells Fn−2 and Fn+2 adjacent to the first unselected memory cells Fn−1 and Fn+1, respectively, to which the second pass voltage Vpass2 may be supplied. That is, in order to reduce a decrease in the threshold voltages of the second unselected memory cells Fn−2 and Fn+2 under the influence of the second pass voltage Vpass2 which gradually rises, the fourth pass voltage Vpass4 gradually falling by the step-down level may be supplied to the second unselected word lines WLn−2 and WLn+2 coupled to the second unselected memory cells Fn−2 and Fn+2. Accordingly, it may be preferred that the step-down level of the fourth pass voltage Vpass4 be set within a range higher than the ground voltage 0 V, but lower than 2 V.

The second pass voltage Vpass2 gradually rises, and the fourth pass voltage Vpass4 gradually falls. Thus, before the program operation is completed, a difference between the second pass voltage Vpass2 and the fourth pass voltage Vpass4 may reach the CD. From this time, a fifth pass voltage Vpass5 which may gradually rise may be supplied to the second unselected word lines WLn−2 and WLn+2 to which the fourth pass voltage Vpass4 was supplied, and a sixth pass voltage Vpass6 which may gradually fall may be supplied to the third unselected word lines WLn−3 and WLn+3 adjacent to the second unselected word lines WLn−2 and WLn+2. That is, when a difference between the second pass voltage Vpass2 and the fourth pass voltage Vpass4 is the CD or higher, the threshold voltages of the memory cells Fn−1 and Fn+1 may decrease due to the second pass voltage Vpass2 which may gradually rise. In order to prevent the decrease in the threshold voltages of the memory cells Fn−1 and Fn+1, the fifth pass voltage Vpass5 gradually rising by a step-up level may be supplied to the second unselected word lines WLn−2 and WLn+2. When the second, fifth, and sixth pass voltage Vpass2, Vpass5, and Vpass6 are supplied to the first to third unselected word lines WLn−1 to WLn−3 and WLn+1 to WLn+3 sequentially adjacent to the selected word line WLn, the ninth pass voltage Vpass9 may continue to be supplied to the remaining unselected word lines WLn−4 to WLn−k and WLn+4 to WLn+k.

If the sixth pass voltage Vpass6 which gradually falls is supplied to the third unselected word lines WLn−3 and WLn+3, a difference between the sixth pass voltage Vpass6 and the ninth pass voltage Vpass9 may reach the CD. From this time, in order to prevent a voltage difference between the third unselected word lines WLn−3 and WLn+3 and the fourth word lines WLn−4 and WLn+4 from further increasing, a tenth pass voltage Vpass10 rising at the same rate as the ninth pass voltage Vpass9 may be supplied to the third unselected word lines WLn31 3 and WLn+3 having potentials dropped to the sixth pass voltage Vpass6.

As described above, since the pass voltages supplied to the first to third unselected word lines WLn−1 to WLn−3 and WLn+1 to WLn+3 adjacent to the selected word line WLn are controlled, a shift in the threshold voltages of the first to third memory cells Fn−1 to Fn−3 and Fn+1 to Fn+3 adjacent to the selected memory cell Fn in the program operation of the selected memory cell Fn can be prevented.

Figure 13:
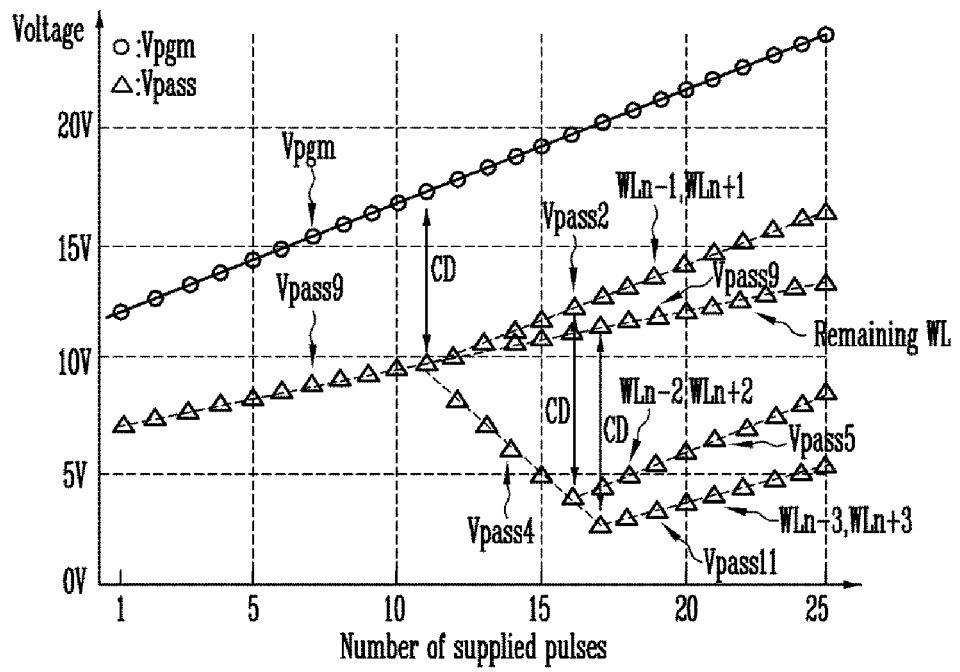
FIG. 13 is a graph illustrating a program method according to a tenth embodiment of this disclosure.

FIG. 13 is a graph illustrating a program method according to a tenth embodiment of this disclosure.

Referring to FIGS. 13 and 3, a program operation may be performed according to an ISPP method of gradually raising the program voltage Vpgm. In the program operation, a program permission voltage (for example, a ground voltage) may be supplied to selected bit lines coupled to selected cell strings, a program inhibition voltage (for example, a power source voltage) may be supplied to unselected bit lines coupled to unselected cell strings. In the state in which the program permission voltage or the program inhibition voltage has been supplied to the bit lines, the program voltage Vpgm which gradually rises may be supplied to a selected word line WLn, and the pass voltage Vpass may be supplied to the remaining unselected word lines WLn−1 to WLn−k and WLn+1 to WLn+k. In the program operation using an ISPP method, the program voltage Vpgm may be raised by a step level. In the program operation, the program voltage Vpgm gradually rising by the step level may be supplied to the selected word line WLn, and a ninth pass voltage Vpass9 may be supplied to the remaining unselected word lines WLn−1 to WLn−k and WLn+1 to WLn+k. The ninth pass voltage Vpass9 may be gradually raised by a level which is lower than the step level of the program voltage Vpgm. That is, an increment of the ninth pass voltage Vpass9 may be smaller than an increment of the program voltage Vpgm. The reason why the ninth pass voltage Vpass9 which gradually rises is supplied to the unselected word lines WLn−1 to WLn−k and WLn+1 to WLn+k as described above may be to prevent the unselected memory cells of the unselected cell string ST from being erased owing to the program voltage Vpgm which gradually rises. That is, since the program inhibition voltage Vcc is supplied to bit lines coupled to the unselected cell strings, channel boosting may be generated due to the program inhibition voltage and the voltage supplied to the word lines WLn−k to WLn+k. At this time, when a gradually rising voltage, such as the ninth pass voltage Vpass9, is supplied, channel boosting may be further efficiently generated, thereby being capable of raising the potential of a channel.

At the early stage of the program operation, a difference between the program voltage Vpgm and the ninth pass voltage Vpass9 may be smaller than a CD. Accordingly, the program voltage Vpgm which gradually rises may be supplied to the selected word line WLn coupled to selected memory cells Fn, the ninth pass voltage Vpass9 which gradually rises may also be supplied to the remaining unselected word lines WLn−1 to WLn−k and WLn+1 to WLn+k. Here, an increment of the ninth pass voltage Vpass9 may be smaller than an increment of the program voltage Vpgm. The CD refers to a maximum voltage difference for preventing the first unselected memory cells Fn−1 and Fn+1 adjacent to the selected memory cells Fn from being erased under the influence of the program voltage Vpgm when the selected memory cells Fn are programmed. The CD may be different according to a semiconductor device and may be calculated by testing the semiconductor device. In the present embodiment, it is assumed, for example only, that the CD is 7.5 V.

If the first program voltage Vpgm supplied to the selected word line WLn is, for example, 12 V and the ninth pass voltage Vpass9 is, for example, 7 V, a difference between the first program voltage Vpgm and the ninth pass voltage Vpass9 is 5 V and is lower than the CD. In this case, the first unselected memory cells Fn−1 and Fn+1 adjacent to the selected memory cells Fn are not greatly influenced by the program voltage Vpgm, and thus the ninth pass voltage Vpass9 may be supplied to all the unselected word lines WLn−1 to WLn−k and WLn+1 to WLn+k. That is, when the threshold voltages of the selected memory cells Fn do not reach a target voltage and until a difference between the program voltage Vpgm and the ninth pass voltage Vpass9 reaches the CD, the program voltage Vpgm may be gradually raised by the step level in proportion to the number of program voltages Vpgm, and the ninth pass voltage Vpass9 may be gradually raised by a level lower than the program voltage Vpgm.

If the program operation is performed while gradually raising the program voltage Vpgm and the ninth pass voltage Vpass9 and a difference between the program voltage Vpgm and the ninth pass voltage Vpass9 reaches the CD, a second pass voltage Vpass2 which gradually rises may be supplied to the first unselected word lines WLn−1 and WLn+1 adjacent to both ends of the selected word line WLn and, at the same time, a fourth pass voltage Vpass4 which gradually falls may be supplied to the second and the third unselected word lines WLn−2 and WLn+2 and WLn−3 and WLn+3 adjacent to the first unselected word lines WLn−1 and WLn+1. At this time, the ninth pass voltage Vpass9 continues to be supplied to the remaining unselected word lines WLn−3 to WLn−k and WLn+3 to WLn+k other than the first unselected word lines WLn−1 and WLn+1 adjacent to the selected word line WLn and the second unselected word lines WLn−2 and WLn+2 adjacent to the first unselected word lines WLn−1 and WLn+1.

The second pass voltage Vpass2 may be gradually raised so that a difference between the second pass voltage Vpass2 and the program voltage Vpgm is not higher than the CD. In order to prevent the efficiency of the program operation from being deteriorated, the second pass voltage Vpass2 preferably may be gradually raised so that a difference between the second pass voltage Vpass2 and the program voltage Vpgm maintains the CD. That is, the step-up level of the second pass voltage Vpass2 may be set identically with the step level of the program voltage Vpgm. That is, in order to prevent the threshold voltages of the second and the third unselected memory cells Fn−2 and Fn+2 and Fn−3 and Fn+3 from decreasing under the influence of the second pass voltage Vpass2 which gradually rises, the fourth pass voltage Vpass4 which gradually falls may be supplied to the second and the third unselected word lines WLn−2, WLn+2, WLn−3, and WLn+3 coupled to the second and the third unselected memory cells Fn−2 and Fn+2, and Fn−3 and Fn+3. It may be preferred that the step-down level of the fourth pass voltage Vpass4 be set within a range higher than the ground voltage 0 V, but lower than 2 V.

The second pass voltage Vpass2 gradually rises, and the fourth pass voltage Vpass4 gradually falls. Thus, before the program operation is completed, a difference between the second pass voltage Vpass2 and the fourth pass voltage Vpass4 may reach the CD. From this time, a fifth pass voltage Vpass5 which gradually rises may be supplied to the second unselected word lines WLn−2 and WLn+2 to which the fourth pass voltage Vpass4 was supplied, and the fourth pass voltage Vpass4 which gradually falls continues to be supplied to the third unselected word lines WLn−3 and WLn+3 adjacent to the second unselected word lines WLn−2 and WLn+2. That is, the second unselected memory cells Fn−2 and Fn+2 may be more influenced by the second pass voltage Vpass2, supplied to the first unselected word lines WLn−1 and WLn+1, than the second unselected memory cells Fn−3 and Fn+3. Thus, the influence of the second pass voltage Vpass2 may be reduced by raising the potential of the second unselected word lines WLn−2 and WLn+2 coupled to the second unselected memory cells Fn−2 and Fn+2. In this case, the ninth pass voltage Vpass9 may continue to be supplied to the remaining unselected word lines WLn−4 to WLn−k and WLn+4 to WLn+k.

When the fourth pass voltage Vpass4 supplied to the third unselected word lines WLn−3 and WLn+3 drops and a difference between the fourth pass voltage Vpass4 and the ninth pass voltage Vpass9 reaches the CD, an eleventh pass voltage Vpass11 rising at the same rate as the ninth pass voltage Vpass9 may be supplied to the third unselected word lines WLn−3 and WLn+3.

As described above, since the pass voltages supplied to the first to third unselected word lines WLn−1 to WLn−3 and WLn+1 to WLn+3 adjacent to the selected word line WLn are controlled, a shift in the threshold voltages of the first to third memory cells Fn−1 to Fn−3 and Fn+1 to Fn+3 adjacent to the selected memory cell Fn in the program operation of the selected memory cell Fn can be prevented.

In the above-described embodiments, the methods of controlling the pass voltages supplied to the first to third unselected word lines WLn−1 to WLn−3 and WLn+1 to WLn+3 adjacent to the selected word line WLn when the program voltage Vpgm is supplied to the selected word line WLn have been described. A program operation may also be performed by controlling the pass voltages supplied to the remaining unselected word lines WLn−4 to WLn−k and WLn+4 to WLn+k as described above.

What is claimed is:

1. A method of operating a semiconductor device, comprising:
   programming selected memory cells by supplying a selected word line with a program voltage which increases and supplying remaining unselected word lines with a first pass voltage which is substantially constant; and
   programming the selected memory cells while supplying first unselected word lines adjacent to the selected word line with a second pass voltage increasing in proportion to the program voltage, when a difference between the program voltage and the first pass voltage reaches a critical voltage difference.

2. The method of claim 1, further comprising programming the selected memory cells by supplying second unselected word lines adjacent to the first unselected word lines, respectively, with a third pass voltage having a voltage potential lower than the first pass voltage by the critical voltage difference, when supplying the second pass voltage to the first unselected word lines.

3. The method of claim 2, wherein the third pass voltage increases in proportion to the program voltage.

4. The method of claim 1, further comprising:
   supplying the second unselected word lines adjacent to the first unselected word lines with a fourth pass voltage which decreases in voltage, when supplying the second pass voltage to the first unselected word lines; and
   supplying the second unselected word lines with a fifth pass voltage increasing in proportion to the program voltage, when a difference between the fourth pass voltage and the second pass voltage reaches the critical voltage difference.

5. The method of claim 4, further comprising:
   supplying third unselected word lines adjacent to the second unselected word lines, respectively, with a sixth pass voltage which decreases, when supplying the fifth pass voltage to the second unselected word lines; and
   supplying the third unselected word lines with a seventh pass voltage which is substantially constant, when a difference between the sixth pass voltage and the first pass voltage reaches the critical voltage difference.

6. The method of claim 1, further comprising:
   supplying second and third unselected word lines sequentially adjacent to the first unselected word lines with a fourth pass voltage which decreases, when supplying the second pass voltage to the first unselected word lines; and
   supplying the second unselected word lines with a fifth pass voltage increasing in proportion to the program voltage and continuing to supply the fourth pass voltage to the third unselected word lines until a difference between the first pass voltage and the fourth pass voltage reaches the critical voltage difference, when a difference between the fourth pass voltage and the second pass voltage reaches the critical voltage difference.

7. The method of claim 6, further comprising supplying the third unselected word lines with an eighth pass voltage which is substantially constant, when a difference between the first pass voltage and the fourth pass voltage supplied to the third unselected word lines reaches the critical voltage difference.

8. A method of operating a semiconductor device, comprising:
   programming selected memory cells coupled to a selected word line by supplying the selected word line with a program voltage which increases and supplying remaining unselected word lines with a ninth pass voltage which increases and has a voltage level lower than the program voltage; and
   programming the selected memory cells by supplying first unselected word lines adjacent to the selected word line with a second pass voltage increasing in proportion to the program voltage, when a difference between the program voltage and the ninth pass voltage reaches a critical voltage difference while programming the selected memory cells.

9. The method of claim 8, further comprising supplying second unselected word lines adjacent to the first unselected word lines, respectively, with a third pass voltage having a voltage potential lower than the ninth pass voltage by the critical voltage difference, when supplying the second pass voltage to the first unselected word lines.

10. The method of claim 9, wherein the third pass voltage increases in proportion to the program voltage.

11. The method of claim 8, further comprising:
   supplying the second unselected word lines adjacent to the first unselected word lines, respectively, with a fourth pass voltage which decreases, when supplying the second pass voltage to the first unselected word lines; and
   supplying the second unselected word lines with a fifth pass voltage increasing in proportion to the program voltage, when a difference between the fourth pass voltage and the second pass voltage reaches the critical voltage difference.

12. The method of claim 11, further comprising:
   supplying third unselected word lines adjacent to the second unselected word lines, respectively, with a sixth pass voltage which decreases, when supplying the fifth pass voltage to the second unselected word lines; and supplying the third unselected word lines with a tenth pass voltage increasing in proportion to the ninth pass voltage, when a difference between the sixth pass voltage and the ninth pass voltage reaches the critical voltage difference.

13. The method of claim 8, further comprising:

supplying second and third unselected word lines sequentially adjacent to the first unselected word lines with a fourth pass voltage which decreases, when supplying the second pass voltage to the first unselected word lines; and supplying the second unselected word lines with a fifth pass voltage increasing in proportion to the second pass voltage and continuing to supply the fourth pass voltage to the third unselected word lines until a difference between the ninth pass voltage and the fourth pass voltage reaches the critical voltage difference, when a difference between the fourth pass voltage and the second pass voltage reaches the critical voltage difference.

14. The method of claim 13, further comprising supplying the third unselected word lines with an eleventh pass voltage which increases in proportion to the ninth pass voltage, when a difference between the ninth pass voltage and the fourth pass voltage supplied to the third unselected word lines reaches the critical voltage difference.

15. A semiconductor device, comprising:

a memory cell array;

a voltage generator for generating a program voltage, a pass voltage, a read voltage, and an erase voltage;

a row decoder for transferring the voltages of the voltage generator to word lines of the memory cell array;

a comparator for comparing the program voltage and the pass voltage of the voltage generator and generating a critical signal when a difference between the program voltage and the pass voltage reaches a critical voltage difference as a result of the comparison; and a controller for increasing or decreasing the pass voltage of the voltage generator in response to the critical signal.

16. The semiconductor device of claim 15, further comprising a page buffer group configured to include latches for storing program data and to transfer the program data to bit lines coupled to the memory cell array in response to page buffer control signals generated from the controller.

17. The semiconductor device of claim 16, wherein the critical voltage difference is a maximum voltage difference for preventing unselected memory cells adjacent to the selected memory cell from being erased owing to the program voltage when a selected memory cell of the memory cell array is programmed.

18. The semiconductor device of claim 17, wherein the selected memory cell of the memory cell array is programmed in accordance with an Incremental Step Pulse Program method.

* * * * *